United States Patent
Vak et al.

(10) Patent No.: US 10,249,441 B2
(45) Date of Patent: Apr. 2, 2019

(54) PROCESS OF FORMING A PHOTOACTIVE LAYER OF A PEROVSKITE PHOTOACTIVE DEVICE

(71) Applicant: COMMONWEALTH SCIENTIFIC AND INDUSTRIAL RESEARCH ORGANISATION, Acton (AU)

(72) Inventors: Doojin Vak, Victoria (AU); Youn-Jung Heo, Clayton (AU)

(73) Assignee: COMMONWEALTH SCIENTIFIC AND INDUSTRIAL RESEARCH ORGANISATION, Acton (AU)

( * ) Notice: Subject to any disclaimer, the term of this patent is extended or adjusted under 35 U.S.C. 154(b) by 0 days.

(21) Appl. No.: 15/537,335

(22) PCT Filed: Jan. 21, 2016

(86) PCT No.: PCT/AU2016/050030
§ 371 (c)(1),
(2) Date: Jun. 16, 2017

(87) PCT Pub. No.: WO2016/115602
PCT Pub. Date: Jul. 28, 2016

(65) Prior Publication Data
US 2017/0338045 A1    Nov. 23, 2017

(30) Foreign Application Priority Data
Jan. 21, 2015    (AU) .................. 2015900169

(51) Int. Cl.
H01G 9/00    (2006.01)
H01L 51/00   (2006.01)
(Continued)

(52) U.S. Cl.
CPC ......... *H01G 9/0029* (2013.01); *H01G 9/2018* (2013.01); *H01L 27/302* (2013.01);
(Continued)

(58) Field of Classification Search
CPC . H01G 9/00; H01G 9/20; H01L 51/00; H01L 51/42
See application file for complete search history.

(56) References Cited

FOREIGN PATENT DOCUMENTS

| EP | 2 804 232 A1 | 11/2014 |
|----|---|---|
| WO | WO-2014/180789 A1 | 11/2014 |
| WO | WO-2015/127494 A1 | 9/2015 |

OTHER PUBLICATIONS

Burschka et al, "Sequential deposition as a route to high-performance perovskite-sensitize solar cells", Nature, vol. 499, No. 7458, Jul. 10, 2013, pp. 316-319.
(Continued)

*Primary Examiner* — Mohammad Choudhry
(74) *Attorney, Agent, or Firm* — Foley & Lardner LLP

(57) ABSTRACT

A process of forming a photoactive layer of a planar perovskite photoactive device comprising: applying at least one layer of a first precursor solution to a substrate to form a first precursor coating on at least one surface of the substrate, the first precursor solution comprising $MX_2$ and $AX$ dissolved in a first coating solvent, wherein the molar ratio of $MX_2$:$AX$=1:n with $0<n<1$; and applying a second precursor solution to the first precursor coating to convert the first precursor coating to a perovskite layer $AMX_3$, the second precursor solution comprising $AX$ dissolved in a second coating solvent, the first precursor solution reacting with the second precursor solution to form a perovskite layer $AMX_3$ on the substrate, wherein A comprises an ammonium group or other nitrogen containing organic cation, M is selected from Pb, Sn, Ge, Ca, Sr, Cd, Cu, Ni, Mn, Co, Zn, Fe, Mg, Ba, Si, Ti, Bi, or In, X is selected from at least one of F, Cl, Br or I.

20 Claims, 6 Drawing Sheets

(51) Int. Cl.
  *H01G 9/20* (2006.01)
  *H01L 51/42* (2006.01)
  *H01L 27/30* (2006.01)

(52) U.S. Cl.
  CPC ........ *H01L 51/0004* (2013.01); *H01L 51/005* (2013.01); *H01L 51/0077* (2013.01); *H01L 51/4233* (2013.01); *H01G 9/2072* (2013.01); *H01G 9/2095* (2013.01); *H01L 51/0007* (2013.01); *H01L 51/4246* (2013.01); *H01L 51/4273* (2013.01); *Y02E 10/549* (2013.01)

(56) References Cited

OTHER PUBLICATIONS

Extended European Search Report in EP Application No. 16739686.0, dated Jul. 27, 2018. (8 pages).

International Search Report & Written Opinion dated Jul. 28, 2016 in International Application No. PCT/AU2016/050030 (10 pages).

Ito S. et al., "Lead-Halide Perovskite Solar Cells by $CH_3NH_3I$ Dripping on $PbIrCH_3NH_3I$-DMSO Precursor Layer for Planar and Porous Structures Using CuSCN Hole-Transporting Material", The Journal of Physical Chemistry Letters, 6 (5), pp. 881-886, Feb. 18, 2015. (Abstract Only).

Xie Y et al., "Enhanced Performance of Perovskite $CH_3NH_3PbI_3$ Solar Cell by Using $CH_3NH_3I$ as Additive in Sequential Deposition", ACS Applied Materials and Interfaces, 7 (23), pp. 12937-12942, May 26, 2015 (Abstract Only).

Zhang T. et al., "Controllable Sequential Deposition of Planar $CH_3NH_3PbI_3$ Perovskite Films via Adjustable Volume Expansion", Nano Letters, 15 (6), pp. 3959-3963, May 21, 2015.

Zhao Y. et al., "$CH_3NH_3Cl$-Assisted One-Step Solution Growth of $CH_3NH_3PbI_3$: Structure, Charge-Carrier Dynamics, and Photovoltaic Properties of Perovskite Solar Cells", The Journal of Physical Chemistry C, 118, pp. 9412-9418, Apr. 16, 2014. (Abstract Only).

Zhao Y. et al., "Three-step sequential solution deposition of $PbI_2$-free $CH_3NH_3PbI_3$ perovskite", Journal of Materials Chemistry A, 3, pp. 9086-9091, Nov. 26, 2014.

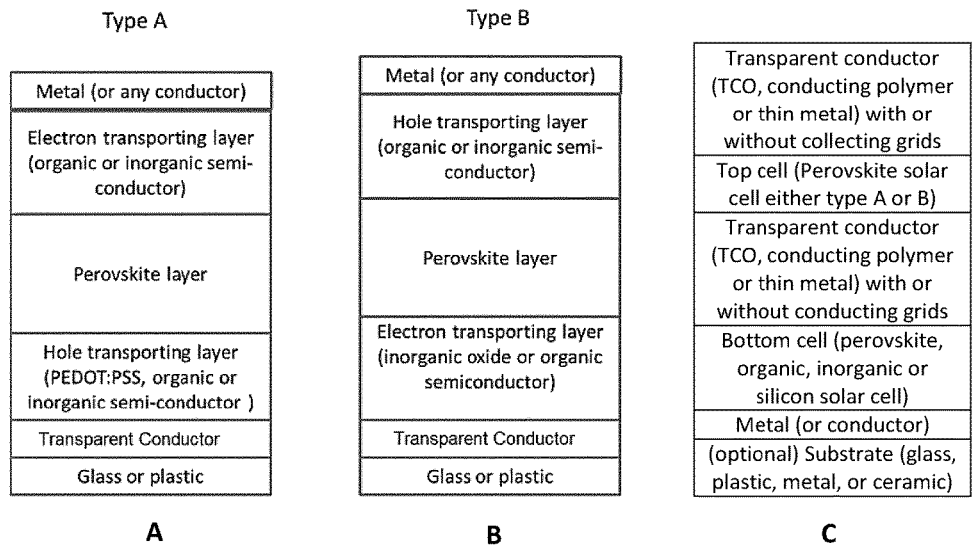
FIGURE 1
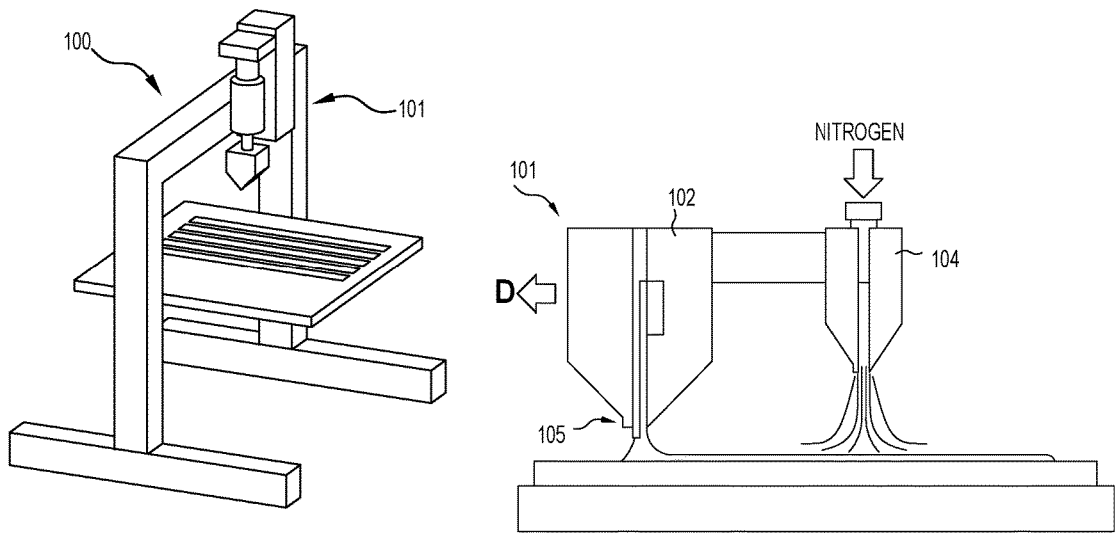
Figure 2a
Figure 2b

PROCESS OF FORMING A PHOTOACTIVE LAYER OF A PEROVSKITE PHOTOACTIVE DEVICE

CROSS-REFERENCE

The present application is a U.S. National Phase Application under 35 U.S.C. 371 of International Application No. PCT/AU2016/050030, filed on 21 Jan. 2016, which claims priority from Australian provisional patent application No. 2015900169 filed on 21 Jan. 2015, of which the disclosures of each are incorporated into this specification.

TECHNICAL FIELD

The present invention generally relates to a process of forming a photoactive layer of a planar perovskite photoactive device. The invention is particularly applicable for perovskite type solar cells and it will be convenient to hereinafter disclose the invention in relation to that exemplary application.

BACKGROUND TO THE INVENTION

The following discussion of the background to the invention is intended to facilitate an understanding of the invention. However, it should be appreciated that the discussion is not an acknowledgement or admission that any of the material referred to was published, known or part of the common general knowledge as at the priority date of the application.

Photovoltaic (PV) cells that convert sunlight directly into electricity are becoming increasingly important in the world's renewable energy mix. A rapidly developing newcomer to the thin film PV field is based on organic-inorganic perovskite-structured semiconductors, the most common of which is the triiodide ($CH_3NH_3PbI_3$). Such Perovskites tend to have high charge-carrier mobilities and therefore make ideal photoactive components.

Perovskite solar cells are named after the characterising crystal structure or "perovskite structure". The photoactive layer consists of perovskite crystals of the very small molecules and ions. This crystal structure is formed rapidly in normal drying processes, and therefore can be difficult to form as a continuous film on a substrate. This is less problematic in typical lab process, particularly when using spin coating to coat a perovskite precursor solution onto a substrate. Spin coating allows for the formation of very homogenous films over an area up to 300 mm in diameter. In a spin coating process, a liquid is applied to a substrate prior to or after acceleration of the substrate to a chosen speed. The substrate spins rapidly and solution on the substrate spreads and dries. Spinning processes quenches crystallization process. Therefore, formation of large size crystals can be minimized or controlled allowing higher coverage to be achieved.

However, it is not possible to use spin coating on a larger scale. Industrial coating process such as slot die coating or any other scalable coating process forms wet film first and then dry the film naturally, by heating or air blowing. This has a significantly different solution dynamic and drying time compared to spin coating. In wet coating, the wet film is susceptible to dewetting, non-homogenous crystal formation and/or the formation of pinholes, all of which have undesirable effects on the function of the photoactive layer. These problems become increasingly more serious the greater the amount and area to which the crystalline material is applied. Resultingly, it is more challenging to form defect free perovskite layers on a given substrate.

It is therefore desirable to provide a new and/or improved process or method of forming a photoactive layer of a perovskite photoactive device such as a solar cell.

SUMMARY OF THE INVENTION

The present invention relates to a method to improve processability of photoactive layer of a planar perovskite photoactive device. The photoactive layer preferably comprises a perovskite layer ($AMX_3$) without a meso-porous inorganic layer.

The present invention provides in a first aspect a process of forming a photoactive layer, preferably a thin film photoactive layer, of a planar perovskite photoactive device comprising:

applying at least one layer of a first precursor solution to a substrate to form a first precursor coating on at least one surface of the substrate, the first precursor solution comprising $MX_2$ and AX dissolved in a first coating solvent, wherein the molar ratio of $MX_2$:AX=1:n with $0<n<1$; and applying a second precursor solution to the first precursor coating to convert the first precursor coating to a perovskite layer $AMX_3$, the second precursor solution comprising AX dissolved in a second coating solvent, thereby forming a photoactive layer of a planar perovskite photoactive device, wherein A comprises an ammonium group or other nitrogen containing organic cation, M is selected from Pb, Sn, Ge, Ca, Sr, Cd, Cu, Ni, Mn, Co, Zn, Fe, Mg, Ba, Si, Ti, Bi, or In, X is selected from at least one of F, Cl, Br or I.

The process of the present invention comprises a sequential coating or deposition process of forming the perovskite layer which includes at least two steps. The process steps comprise a first coating step in which a first precursor solution comprising $MX_2$ is applied to a substrate, followed by a second step comprising a conversion process to $AMX_3$. In the present invention, a coating of AX is applied to the first coating which reacts with $MX_2$ to convert $MX_2$ to $AMX_3$. The AX from the first precursor solution is incorporated into the final perovskite layer $AMX_3$. In conventional sequential coating processes a photoactive layer of perovskite crystals undergoes rapid crystallisation when AX is applied to the $MX_2$ layer. When the process is scaled up, a continuous film layer comprising a uniform crystal structure is difficult to fabricate due to this rapid crystallisation.

Due to the volatile nature of AX, equivalent or excess amount of AX compared to $MX_2$ have been widely used when forming a perovskite layer using a perovskite precursor solution (single step) or precursor solutions (sequential deposition process). Thus despite conventional wisdom of using equivalent or excess amount of AX compared to $MX_2$, the inventors have surprisingly discovered that the addition of a less than stoichiometric amount (i.e. greater than 0 but less than 1) of AX to $MX_2$ in the first precursor solution applied to the substrate interferes with the crystallization of the perovskite layer in the sequential deposition process. Whilst a number of additives have been previously mixed with $MX_2$ in an attempt to control crystallisation, the use of AX in the first precursor solution advantageously does not contaminate the perovskite composition, as this additive is a reactant added in the second step. The AX from the first precursor solution is incorporated into the final perovskite layer $AMX_3$. No prior process has used a precursor solution having a lower than 1 molar ratio of AX in $MX_2$, and more particularly to provide the advantage of interfering with the crystallization of the perovskite layer in the sequential deposition process.

Whilst not wishing to be limited to any one theory, the Inventors consider that non-stoichiometric amounts of AX in $MX_2$ acts as a kinetic barrier in crystallisation of the $MX_2$ when the mixed precursor solution is applied in the first step. Furthermore, the solid film of the first precursor solution is thermodynamically less stable compared to a crystalline $MX_2$ film formed of pure $MX_2$. The $MX_2$ with AX additive layer can be converted to perovskite in shorter reaction time compared to a pure $MX_2$ layer once a stoichiometric amount of AX is applied in the second precursor solution. The process of the present invention can therefore improve yield of the perovskite product in the photoactive layer, efficiency of a solar cell which includes the inventive photoactive layer and the production speed of perovskite solar cells formed using the inventive photoactive layer.

The present invention therefore uses an AX additive to alter the crystallisation characteristics of the conventional sequential deposition process of forming the perovskite layer. Importantly, the amount of AX additive in the first precursor solution is less than the stoichiometric required for the reaction with $MX_2$ to form the perovskite crystals to $AMX_3$. This requires the molar ratio of $MX_2:AX=1:n$ with $0<n<1$.

The exact molar ratio is dependent on a number of factors, including the nature of the compounds AX and $MX_2$. Accordingly, in some embodiments, the molar ratio of $MX_2:AX=1:n$ with $0<n\leq0.5$, preferably $0.05\leq n\leq0.4$, preferably $0.05\leq n\leq0.45$, preferably $0.1\leq n\leq0.4$, more preferably $0.15\leq n\leq0.3$, yet more preferably $0.2\leq n\leq0.3$, and even more preferably $0.2\leq n\leq0.40$. In some embodiments, the molar ratio of $MX_2:AX=1:n$ with $0.2\leq n\leq0.24$. In some embodiments, the molar ratio of $MX_2:AX=1:n$ with $0.15\leq n\leq0.3$, preferably $0.2\leq n\leq0.25$, yet more preferably $0.25\leq n\leq0.35$. In some embodiments, the molar ratio of $MX_2:AX=1:n$ with $0.05\leq n\leq0.3$, preferably $0.1\leq n\leq0.3$, more preferably $0.15\leq n\leq0.24$. In some embodiments, the molar ratio of $MX_2:AX=1:n$ with $0.15\leq n\leq0.5$, preferably $0.2\leq n\leq0.4$, more preferably $0.15\leq n\leq0.35$, preferably $0.25\leq n\leq0.35$.

The first and second coating solvents are selected for the sequential application of the coatings. Accordingly, the first coating solvent is selected so that it can dissolve both $MX_2$ and AX. However, the second coating solvent must be selected so that it can dissolve AX, not $MX_2$. $MX_2$ should have a low, preferably substantially low solubility in the second coating solvent. In preferred embodiments, $MX_2$ is not soluble in the second coating solvent. This low solubility is required to ensure that the surface and structure of the applied $MX_2$ layer is not affected by the application of the second AX coating applied over the first applied $MX_2$ layer. Suitable solvents for the first coating solvent are typically polar aprotic solvents including at least one of DMF, DMSO, γ-butyrolactone, acetone, acetyl acetone, ethyl acetoacetate, NMP, DMAC, THF or combinations thereof. Suitable solvents for the second coating solvent are typically polar protic solvents including isopropanol, n-butanol, isobutanol, ethanol, methanol, acetic acid, ethylene glycol, propylene glycol, glycerol, allyl alcohol, propagyl alcohol, inositol or combinations thereof.

Any number of coating application techniques can be used. The first precursor solution and the second precursor solution can be applied to the substrate by any number of suitable application techniques. Suitable techniques for applying the first precursor solution to the substrate and/or the second precursor solution to the first precursor coating include, but should not be limited to, at least one of: casting, doctor blading, screen printing, inkjet printing, pad printing, knife coating, meniscus coating, slot die coating, gravure coating, reverse gravure coating, kiss coating, micro-roll coating, curtain coating, slide coating, spray coating, flexographic printing, offset printing, rotatory screen printing, or dip coating. In some embodiments, the first precursor solution is applied to the substrate using a slot die coating technique/process. The second precursor solution is the applied to the first precursor coating on the substrate using either a dipping process or another technique, for example slot die coating. In some embodiments, the first precursor solution and the second precursor solution is applied to the substrate and/or first precursor coating respectively using a slot die coating technique/process.

In some embodiments, the process of the present invention further includes the step of drying the applied first and/or second precursor solution. The drying step can comprise any number of drying process including one or a combination of air dry, convective drying, ambient drying, heat treatment, annealing, quenching, or the like. In some embodiments, drying the applied the first and/or second precursor solution includes heat treatment of the first precursor coating at a temperature of at least 60° C., preferably at least 70° C., more preferably at least 100° C., and yet more preferably at least 120° C. In some embodiments, the process includes the step of: drying the first precursor coating prior to applying the second precursor solution.

In some embodiments, each applied coating/layer of the first and second precursor solution is air dried. In other embodiments, convective or forced drying techniques are used. In some embodiments, heat can be applied to encourage evaporation of the respective first coating solvent or second coating solvent. In some embodiments, a gas-quenching technique is used to rapidly dry the respective coating/layer of first or second precursor solution. It should be appreciated that gas-quenching comprising the rapid cooling and drying of the applied layer(s) or the first and/or second precursor solution through the application of a drying gas, such as nitrogen, argon or other inert gas. In a preferred embodiment, high pressure nitrogen at room temperature is used for the gas-quenching step.

In some embodiments, the $MX_2$ coating layer (comprising $MX_2$ and AX additive) formed by applying the first precursor solution to the substrate can be converted to a more reactive form by using a solvent vapour soaking technique. In these embodiments, the process of the present invention further includes the step of: subjecting the first precursor coating to a solvent vapour soaking process prior to applying the second precursor solution to the first precursor coating. The substrate is preferably subjected to the solvent vapour soaking process immediately after the first precursor coating is applied to the substrate.

Solvent vapour soaking techniques can be particularly effective if the first precursor solution is rapidly dried once applied to the substrate, for example using a gas quenching technique (discussed below). In embodiments, the solvent vapour soaking process preferably comprises storing the substrate with the first precursor coating in an enclosure, preferably a gas tight enclosure, as soon as the first precursor solution is applied to the substrate. Where gas quenching is used, solvent vapour soaking process may comprise storing the substrate with first precursor coating in an enclosure, preferably a gas tight enclosure, as soon as the first precursor solution is applied to the substrate and gas quenching step is completed. In presence of solvent vapour, ions in the solid film become mobile and move to form thermodynamically more stable crystal. In this process, it may create sub-micro-size cracks which allow AX to penetrate into $MX_2$ more rapidly and deeply. Thus, in many embodiments, the dried first precursor solution layer shows a much faster conversion to perovskite when it was dipped in AX solution.

The first and second precursor solutions comprise reactants for a molecule $AMX_3$ which crystallises with perovskite structure.

One of the reactants preferably comprises at least one compound having the formula $MX_2$, or at least one reaction constituent for forming at least one compound having the formula $MX_2$, in which M is selected from Pb, Sn, Ge, Ca, Sr, Cd, Cu, Ni, Mn, Co, Zn, Fe, Mg, Ba, Si, Ti, Bi, or In and X is selected from at least one of F, Cl, Br or I. In some embodiments, M is selected from $Pb^{2+}$, $Sn^{2+}$, $Ge^{2+}$, $Ca^{2+}$, $Sr^{2+}$, $Cd^{2+}$, $Cu^{2+}$, $Ni^{2+}$, $Mn^{2+}$, $Co^{2+}$, $Zn^{2+}$, $Fe^{2+}$, $Mg^{2+}$ or $Ba^{2+}$ and X is selected from at least one of $F^-$, $Cl^-$, $Br^-$ or $I^-$. In preferred embodiments, M is selected from Pb, Sn, Ge, Si, Ti, Bi, or In. In some embodiments, $MX_2$ comprises at least one of $PbCl_2$, $PbI_2$, $PbBr_2$, $SnCl_2$, $SnI_2$, $SnBr_2$, $ZnCl_2$, $ZnI_2$, $ZnBr_2$, $FeCl_2$ or $FeBr_2$. In preferred embodiments, M comprises Pb, and more preferably $MX_2$ comprises $PbCl_2$, $PbI_2$ or $PbBr_2$. It should be appreciated that the first precursor solution may comprise a single $MX_2$ compound or a mixture of different (two or more) $MX_2$ compounds in solution.

Similarly, one of the reactants preferably comprises at least one compound having the formula AX, or at least one reaction constituent for forming at least one compound having the formula AX, in which A comprises an ammonium group or other nitrogen containing organic cation and X is selected from at least one of F, Cl, Br or I. It should be appreciated that the first precursor solution and second precursor solution may comprise a single AX compound or a mixture of different (two or more) AX compounds in solution.

The term "perovskite", as used herein, refers to a material with a three-dimensional crystal structure related to that of $CaTiO_3$ or a material comprising a layer of material, wherein the layer has a structure related to that of $CaTiO_3$. The structure of $CaTiO_3$ can be represented by the formula $AMX_3$, wherein A and M are cations of different sizes and X is an anion. M is selected from Pb, Sn, Ge, Ca, Sr, Cd, Cu, Ni, Mn, Co, Zn, Fe, Mg, Ba, Si, Ti, Bi, or In and X is selected from at least one of F, Cl, Br or I. In many embodiments, M comprises a metal cation, and more preferably a divalent metal cation such as $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. In some embodiments, the second cation may be selected from $Sn^{2+}$, $Pb^{2+}$ and $Cu^{2+}$. In preferred embodiments, M is selected from Pb, Sn, Ge, Si, Ti, Bi, or In.

In the unit cell, the A cations are at (0,0,0), the M cations are at (½, ½, ½) and the X anions are at (½, ½, 0). The A cation is usually larger than the M cation. The skilled person will appreciate that when A, M and X are varied, the different ion sizes may cause the structure of the perovskite material to distort away from the structure adopted by $CaTiO_3$ to a lower-symmetry distorted structure. The symmetry will also be lower if the material comprises a layer that has a structure related to that of $CaTiO_3$. Materials comprising a layer of perovskite material are well known. For instance, the structure of materials adopting the K2iF4-type structure comprises a layer of perovskite material.

The perovskite semiconductor employed in the present invention is typically one which is capable of (i) absorbing light, and thereby generating free charge carriers; and/or (ii) emitting light, by accepting charge, both electrons and holes, which subsequently recombine and emit light. Thus, the perovskite employed is typically a light-absorbing and/or a light-emitting perovskite. The perovskite semiconductor employed in the present invention may therefore be a perovskite which acts as an n-type, electron-transporting semiconductor when photo-doped. Alternatively, it may be a perovskite which acts as a p-type hole-transporting semiconductor when photo-doped. Thus, the perovskite may be n-type or p-type, or it may be an intrinsic semiconductor. In preferred embodiments, the perovskite employed is one which acts as an n-type, electron-transporting semiconductor when photo-doped.

In some embodiments, A in AX comprises an organic cation having the formula $(R_1R_2R_3R_4N)$, wherein:

$R_1$ is hydrogen, unsubstituted or substituted C1-C20 alkyl, or unsubstituted or substituted aryl;

$R_2$ is hydrogen, unsubstituted or substituted C1-C20 alkyl, or unsubstituted or substituted aryl;

$R_3$ is hydrogen, unsubstituted or substituted C1-C20 alkyl, or unsubstituted or substituted aryl; and $R_4$ is hydrogen, unsubstituted or substituted C1-C20 alkyl, or unsubstituted or substituted aryl.

In some embodiments, $R_1$ in the organic cation is hydrogen, methyl or ethyl, $R_2$ is hydrogen, methyl or ethyl, $R_3$ is hydrogen, methyl or ethyl, and $R_4$ is hydrogen, methyl or ethyl. For instance $R_1$ may be hydrogen or methyl, $R_2$ may be hydrogen or methyl, $R_3$ may be hydrogen or methyl, and $R_4$ may be hydrogen or methyl. In some embodiments, F can be a substituent of the alkyl chain attached to N or the sub-alkyl chain from the N.

In some embodiments, A in AX comprises an organic cation having the formula $(R_5R_6N=CH-NR_7R_8)$, and wherein:

$R_5$ is hydrogen, unsubstituted or substituted C1-C20 alkyl, or unsubstituted or substituted aryl;

$R_6$ is hydrogen, unsubstituted or substituted C1-C20 alkyl, or unsubstituted or substituted aryl;

$R_7$ is hydrogen, unsubstituted or substituted C1-C20 alkyl, or unsubstituted or substituted aryl; and $R_8$ is hydrogen, unsubstituted or substituted C1-C20 alkyl, or unsubstituted or substituted aryl.

Alternatively, the organic cation may have the formula $(R_5NH_3)^+$ wherein: $R_5$ is hydrogen, or unsubstituted or substituted C1-C20 alkyl. For instance, $R_5$ may be methyl or ethyl. Typically, $R_5$ is methyl.

In some embodiments, the organic cation has the formula $R_5R_6N=CH-NR_7R_8$ wherein: $R_5$ is hydrogen, unsubstituted or substituted C1-C20 alkyl, or unsubstituted or substituted aryl; $R_6$ is hydrogen, unsubstituted or substituted C1-C20 alkyl, or unsubstituted or substituted aryl; $R_7$ is hydrogen, unsubstituted or substituted C1-C20 alkyl, or unsubstituted or substituted aryl; and $R_8$ is hydrogen, unsubstituted or substituted C1-C20 alkyl, or unsubstituted or substituted aryl. Typically, $R_5$ in the cation is hydrogen, methyl or ethyl, $R_6$ is hydrogen, methyl or ethyl, $R_7$ is hydrogen, methyl or ethyl, and $R_8$ is hydrogen, methyl or ethyl. For instance $R_5$ may be hydrogen or methyl, $R_6$ may be hydrogen or methyl, $R_7$ may be hydrogen or methyl, and $R_8$ may be hydrogen or methyl. The organic cation may, for example, have the formula $(H_2N=CH-NH_2)^+$.

As used herein, an alkyl group can be a substituted or unsubstituted, linear or branched chain saturated radical, it is often a substituted or an unsubstituted linear chain saturated radical, more often an unsubstituted linear chain saturated radical. A C1-C20 alkyl group is an unsubstituted or substituted, straight or branched chain saturated hydrocarbon radical. Typically it is C1-C10 alkyl, for example methyl, ethyl, propyl, butyl, pentyl, hexyl, heptyl, octyl, nonyl or decyl, or C1-C6 alkyl, for example methyl, ethyl, propyl, butyl, pentyl or hexyl, or C1-C4 alkyl, for example methyl, ethyl, i-propyl, n-propyl, t-butyl, s-butyl or n-butyl.

When an alkyl group is substituted it typically bears one or more substituents selected from substituted or unsubstituted C1-C20 alkyl, substituted or unsubstituted aryl (as defined herein), cyano, amino, C1-C10 alkylamino, di(C1-C10)alkylamino, arylamino, diarylamino, arylalkylamino, amido, acylamido, hydroxy, oxo, halo, carboxy, ester, acyl, acyloxy, C1-C20 alkoxy, aryloxy, haloalkyl, sulfonic acid, sulfhydryl (i.e. thiol, —SH), d-C10 alkylthio, arylthio, sulfonyl, phosphoric acid, phosphate ester, phosphonic acid and phosphonate ester. Examples of substituted alkyl groups include haloalkyl, hydroxyalkyl, aminoalkyl, alkoxyalkyl and alkaryl groups. The term alkaryl, as used herein, pertains to a C1-C20 alkyl group in which at least one hydrogen atom has been replaced with an aryl group. Examples of such groups include, but are not limited to, benzyl (phenylmethyl, PhCH$_2$—), benzhydryl (Ph$_2$CH—), trityl (triphenylmethyl, Ph$_3$C—), phenethyl (phenylethyl, Ph-CH$_2$CH$_2$—), styryl (Ph-CH═CH—), cinnamyl (Ph-CH═CH—CH$_2$—). Typically a substituted alkyl group carries 1, 2 or 3 substituents, for instance 1 or 2.

An aryl group is a substituted or unsubstituted, monocyclic or bicyclic aromatic group which typically contains from 6 to 14 carbon atoms, preferably from 6 to 10 carbon atoms in the ring portion. Examples include phenyl, naphthyl, indenyl and indanyl groups. An aryl group is unsubstituted or substituted. When an aryl group as defined above is substituted it typically bears one or more substituents selected from C1-C6 alkyl which is unsubstituted (to form an aralkyl group), aryl which is unsubstituted, cyano, amino, C1-C10 alkylamino, di(C1-C10)alkylamino, arylamino, diarylamino, arylalkylamino, amido, acylamido, hydroxy, halo, carboxy, ester, acyl, acyloxy, C1-C20 alkoxy, aryloxy, haloalkyl, sulfhydryl (i.e. thiol, —SH), C1-10 alkylthio, arylthio, sulfonic acid, phosphoric acid, phosphate ester, phosphonic acid and phosphonate ester and sulfonyl. Typically it carries 0, 1, 2 or 3 substituents. A substituted aryl group may be substituted in two positions with a single C1-C6 alkylene group, or with a bidentate group represented by the formula —X—(C1-C6)alkylene, or —X—(C1-C6)alkylene-X—, wherein X is selected from O, S and R, and wherein R is H, aryl or C1-C6 alkyl. Thus a substituted aryl group may be an aryl group fused with a cycloalkyl group or with a heterocyclyl group. The ring atoms of an aryl group may include one or more heteroatoms (as in a heteroaryl group). Such an aryl group (a heteroaryl group) is a substituted or unsubstituted mono- or bicyclic heteroaromatic group which typically contains from 6 to 10 atoms in the ring portion including one or more heteroatoms. It is generally a 5- or 6-membered ring, containing at least one heteroatom selected from O, S, N, P, Se and Si. It may contain, for example, 1, 2 or 3 heteroatoms. Examples of heteroaryl groups include pyridyl, pyrazinyl, pyrimidinyl, pyridazinyl, furanyl, thienyl, pyrazolidinyl, pyrrolyl, oxazolyl, oxadiazolyl, isoxazolyl, thiadiazolyl, thiazolyl, isothiazolyl, imidazolyl, pyrazolyl, quinolyl and isoquinolyl. A heteroaryl group may be unsubstituted or substituted, for instance, as specified above for aryl. Typically it carries 0, 1, 2 or 3 substituents.

The perovskite semiconductor layer of the invention typically comprises at least one anion X selected from halide anions and chalcogenide anions. The term "halide" refers to an anion of a group 7 element, i.e., of a halogen. Typically, halide refers to a fluoride anion, a chloride anion, a bromide anion, an iodide anion or an astatide anion. The term "chalcogenide anion", as used herein refers to an anion of a group 6 element, i.e. of a chalcogen. Typically, chalcogenide refers to an oxide anion, a sulphide anion, a selenide anion or a telluride anion. In preferred embodiments, the anion X is selected from at least one of F, Cl, Br or I.

In some embodiments, the perovskite layer comprises an organo-metal halide perovskite. In these embodiments, the first cation A is an organic cation, more preferably an ammonium group or other nitrogen containing organic cation. This organic cation (A) in this type of perovskite can comprise a large number of organic cation including protonated alkylamines, cycloalkylamines (such as pyrrolidine or cyclohexyl amine) arylamines and aromatic heterocycles (such as pyridine). In some embodiments, A comprises cations having the general formula RCH$_2$NH$_3$$^+$, RC(NH$_2$)$_2$$^+$, R$_a$R$_b$CH$_1$NH$_3$$^+$, R$_a$R$_b$R$_c$CNH$_3$$^+$, R$_a$R$_b$NH$_2$$^+$, or R$_a$R$_b$R$_c$NH$^+$, where R, R$_a$, R$_b$, R$_c$ comprises H or a substituted or unsubstituted alkyl group or groups, preferably a C$_1$ to C$_6$ substituted or unsubstituted alkyl or aryl group or groups.

Whilst a number of organo-metal halide perovskite are possible, preferred A of a perovskite precursor comprises at least one of CH$_3$NH$_3$$^+$, or HC(NH$_2$)$_2$$^+$. Thus, in some embodiments the perovskite precursor AX is selected from the group consisting of CH$_3$NH$_3$X and HC(NH$_2$)$_2$X, and wherein X is selected from at least one of F, Cl, Br or I. For example, perovskite precursor may comprise a mixture of CH$_3$NH$_3$Cl and CH$_3$NH$_3$I. Accordingly, in preferred embodiments AX comprises CH$_3$NH$_3$X.

The resulting perovskite layer preferably comprises an organo-metal halide perovskite. For example, in some embodiments the perovskite layer comprises at least one of CH$_3$NH$_3$MX$_3$ or HC(NH$_2$)$_2$MX$_3$, in which, M is selected from Pb, Sn, Tl, Bi, or In; and X is selected from at least one of F, Cl, Br or I. In other embodiments, the perovskite comprises an organo-lead halide perovskite, preferably comprising at least one of CH$_3$NH$_3$PbX$_3$ or HC(NH$_2$)$_2$PbX$_3$, in which X is selected from at least one of F, Cl, Br or I.

In some embodiments, in the optoelectronic device of the invention, the perovskite is a perovskite compound selected from CH$_3$NH$_3$PbI$_3$, CH$_3$NH$_3$PbBr$_3$, CH$_3$NH$_3$PbCl$_3$, CH$_3$NH$_3$PbF$_3$, CH$_3$NH$_3$PbBrI$_2$, CH$_3$NH$_3$PbBrCl$_2$, CH$_3$NH$_3$PbIBr$_2$, CH$_3$NH$_3$PbICl$_2$, CH$_3$NH$_3$PbClBr$_2$, CH$_3$NH$_3$PbI$_2$Cl, CH$_3$NH$_3$SnBrI$_2$, CH$_3$NH$_3$SnBrCl$_2$, CH$_3$NH$_3$SnF$_2$Br, CH$_3$NH$_3$SnIBr$_2$, CH$_3$NH$_3$SnICl$_2$, CH$_3$NH$_3$SnF$_2$I, CH$_3$NH$_3$SnClBr$_2$, CH$_3$NH$_3$SnI$_2$Cl or CH$_3$NH$_3$SnF$_2$Cl.

Of course, X does not necessarily need to be a single halide. The resulting perovskite layer can include a mixed halide perovskite wherein X in CH$_3$NH$_3$MX$_3$ or HC(NH$_2$)$_2$MX$_3$ comprises two or more of F, Cl, Br or I. Accordingly, CH$_3$NH$_3$MX$_3$ could comprise CH$_3$NH$_3$MCl$_x$I$_{3-x}$, CH$_3$NH$_3$MI$_{3-x}$Cl$_x$ or similar. It should be appreciated that CH$_3$NH$_3$MCl$_x$I$_{3-x}$, CH$_3$NH$_3$MI$_{3-x}$Cl$_x$ or similar can comprise non-stoichiometric materials in which M is selected from at least one of Pb, Sn, Ge, Si, Ti, Bi, or In, preferably M is Pb. In an exemplary embodiment, the perovskite layer is one of the family CH$_3$NH$_3$PbCl$_x$I$_{3-x}$. In preferred embodiments, x is close to zero (i.e. very small chloride content). In other embodiments, x=0 providing a tri-iodide perovskite material layer.

The second precursor solution comprises the component AX dissolved in the second coating solvent. In some embodiments, the second precursor solution comprises from 5 to 75 wt % AX. In some embodiments, the second precursor solution comprises from 10 to 70 wt % AX, more preferably from 20 to 60 wt % AX, yet more preferably from 25 to 50 wt % AX. In one embodiment, the second precursor solution comprises about 40 wt % AX.

The applied layers of the first and second precursor solutions can be applied to any suitable substrate. The substrate preferably comprises a substantially planar substrate, preferably a planar substrate in order to form a photoactive layer of a planar perovskite photoactive device. It should be appreciated that the substrate selected for the photoactive layer will be selected to suit the particular photoactive device and application thereof. Suitable substrates include polymers, metals, ceramics and glasses. In some embodiments, particularly flexible photoactive devices, such as flexible solar cell applications, the substrate comprises a polymer film.

As will be appreciated, the substrate can include one or more layers or coatings onto which the applied layer is applied. These coatings are preferably selected from at least one of:
  at least one coating of a transparent conductive oxide (TCO);
  at least one electrode screening layer;
  at least one hole blocking layer;
  at least one electron blocking layer;
  at least one hole transporting layer; or at least one electron transporting layer.

For example, the substrate can includes the following coatings:
  at least one coating of a transparent conductive oxide (TCO) and at least one hole transporting layer applied to the TCO; or
  at least one coating of a TCO and at least one electron transporting layer applied to the TCO.

In another example, the substrate can includes the following coatings:
  at least one coating of a transparent conductive oxide (TCO) and at least one hole transporting layer applied to the TCO; or
  at least one coating of a TCO and at least one electrode screening layer applied to the TCO.

The electrode screening material can be coated at a thickness of between 10 to 25 nm.

In some embodiments, the at least one hole transporting layer comprises an organic or inorganic semiconductor. In some embodiments, the at least one electron transporting layer comprises an organic or inorganic conductor.

The coatings applied to the substrate typically depend on the configuration of the photoactive device in which the applied photoactive layer forms part of. In a conventional structure of a photoactive device layer the substrate includes at least one coating of a transparent conductive oxide (TCO) and at least one hole transporting layer applied to the TCO. In an inverted structure of a photoactive device layer the substrate includes at least one coating of a TCO and at least one electron transporting layer applied to the TCO. Of course various other layers are possible depending on the desired structure of the photoactive device, as would be evident to one skilled in the art.

It should be appreciated that not all photoactive device structures will use TCO. For example, perovskite cells can be prepared on silicon solar cell to produce tandem solar cells. Furthermore, a printed conducting layer can be used instead of TCO. In some embodiments, a photoactive device including a photoactive layer made according to the present invention could be made directly on TCO. The present invention is intended to encompass all these embodiments.

The photoactive layer formed by the process of the present invention is one of a number of layers of an optoelectronic device or photoactive device such as a solar cell. Solar cells, particularly thin film and flexible solar cells are formed as a multilayer coating on a substrate. Each layer can be formed by one of a number of coating techniques. Suitable techniques include casting, doctor blading, screen printing, inkjet printing, pad printing, knife coating, meniscus coating, slot die coating, gravure coating, reverse gravure coating, kiss coating, micro-roll coating, curtain coating, slide coating, spray coating, flexographic printing, offset printing, rotatory screen printing, or dip coating.

The present invention also relates to one or more optoelectronic device including a photoactive layer formed using a process according to the present invention. The present invention also relates to one or more photoactive devices which include a photoactive layer formed using a process according to the present invention. The optoelectronic device can comprise a large range of photoactive devices such as photoelectric, photovoltaic and the like devices, including but not limited photovoltaic cells, photoactive sensors, including photodetectors, or the like.

An optoelectronic device according the present invention could therefore comprise a photoactive device, such as a photovoltaic cell, a photoactive sensor or a light emitting device. In some embodiments, the optoelectronic device can be selected from a photodiode; a phototransistor; a photomultiplier; a photo resistor; a photo detector; a light-sensitive detector; solid-state triode; a battery electrode; a light emitting device; a light emitting diode; a transistor; a solar cell; a laser; and a diode injection laser.

An optoelectronic device or photoactive device including a photoactive layer formed by the process of the present invention can be formed as an inverted structure or a conventional structure. A conventional structure is formed with a substrate having the following layers successively layered on a surface thereof: a transparent conductive oxide (TCO) layer, followed by a hole transporting layer; followed by the photoactive layer; followed by an electron transporting layer, and followed by a conductor layer (typically a metal). An inverted structure is formed with a substrate having the following layers successively layered on a surface thereof: a transparent conductive oxide (TCO) layer, followed by an electron transporting layer; followed by the photoactive layer; followed by a hole transporting layer, and followed by a conductor layer (typically a metal). A hole transporting (p-type) layer can be any hole-conducting material with appropriate valence band edge.

The perovskite precursor preferably form the intrinsic (i) layer of an optoelectronic device. The various other layers can comprise a number of suitable components currently known in the art. For example:
  Suitable transparent conductive oxides (TCO) include tin doped indium oxide (ITO), fluoride-doped tin oxide (FTO), doped zinc oxide such as aluminium doped zinc oxide (AZO), or indium doped cadmium-oxide;
  Suitable hole transporting layers include a transparent conducting polymer such as at least one of Poly(3,4-ethylenedioxythiophene) (PEDOT), poly(3,4-ethylenedioxythiophene) and polystyrene sulfonate mixture (PEDOT:PSS), poly(4,4-dioctylcyclopentadithiophene); Poly(3-hexylthiophene-2,5-diyl) (P3HT), Poly [bis(4-phenyl)(2,4,6-trimethylphenyl)amine] (PTAA), poly[N-9"-heptadecanyl-2,7-carbazole-alt-5,5-(4',7'-di-2-thienyl-2',1',3'-benzothiadiazole)] (PCDTBT), poly[2,6-(4,4-bis-(2-ethylhexyl)-4H-cyclopenta[2,1-b;3,4-b']dithiophene)-alt-4,7(2,1,3-benzothiadiazole)] (PCPDTBT), poly(N-alkyldiketopyrrolopyrroledithienylthieno[3,2-b]thiophene) (DPP-DTT), 2,2(7,7(-tetrakis-(N,N-di-pmethoxyphenylamine)9,9(-spirobifluorene) (spiro-OMeTAD), MoO$_3$ or the like (with or without suitable dopants);

Suitable electron transporting layers include zinc oxide, titanium dioxide, tungsten trioxide or the like; and Suitable conductor layers comprise Au, Ag, C (for example graphite/carbon black, CNTs, vapour-grown carbon fibres graphene or the like), Al, Mg, Cu or suitable alloys thereof or the like.

It should be appreciated that the present invention can be used to form single junction or multijunction cells. Multijunction (MJ) solar cells comprise solar cells with multiple p-n junctions, preferably made of different semiconductor materials. Each material's p-n junction will produce electric current in response to different wavelengths of light. Multijunction cells can be produced by layering a series of perovskite layers/structures formed using the process of the present invention. The use of multiple semiconducting materials allows the absorbance of a broader range of wavelengths, improving the cell's sunlight to electrical energy conversion efficiency. Examples of multijunction cells include the use with Si as a tandem structure, but also including multijunction perovskites where a distinct advantage of electrodeposited or vapour deposited embodiments is the ability to form multi-layered stacks of thin-films over large areas. In this respect, quantification of the spectral band edge of perovskite materials of varying composition. For example, in some embodiments, successive layers of a halide series from I, Cl, Br etc. would enable spectral tuning of the device and lead to a broader spectral response and higher efficiency.

Accordingly, an optoelectronic device or photoactive device including a photoactive layer formed by the process of the present invention can be formed as a tandem structure. In a tandem structure or tandem devices, a stack of two photoactive devices is formed thereby including two stacked layers of a photoactive structure. The stack of solar cells works at the same time and improves efficiency of the overall device. For example, in some tandem solar cells, the device comprises a stack of two conventional structured photoactive devices. This structure would therefore comprise the following layers successively layered on a surface thereof: a transparent conductive oxide (TCO) layer, followed by a hole transporting layer (HTL); followed by a first photoactive layer; followed by an electron transporting layer (ETL), a transparent conductive oxide (TCO) layer, followed by a hole transporting layer (HTL); followed by a second photoactive layer; followed by an electron transporting layer (ETL) and followed by a conductor layer (typically a metal). In other tandem solar cells, the device may comprise a stack of two inverted structured photoactive devices. This structure would therefore comprise two stacked solar cell structures having the following layers successively layered on a surface thereof: a transparent conductive oxide (TCO) layer, followed by an electron transporting layer; followed by a first photoactive layer; followed by a hole transporting layer, a transparent conductive oxide (TCO) layer, followed by an electron transporting layer; followed by a second photoactive layer; followed by a hole transporting layer and followed by a conductor layer (typically a metal). The first and second photoactive layers of the above structures could be the same or a different perovskite layer. Similarly, the stacked structure could include two different types of solar cell configurations. For example, an organic solar cell or Si solar cell stacked with a solar cell including a photoactive layer produced according to the present invention. It should be appreciated that the other solar cell could comprise any other type of photoactive cell including organic solar cells and even other perovskite solar cells. A photoactive device such as a solar cell which includes the perovskite photoactive layer of the present invention could be one or both of the bottom cell or top cell of a tandem device. In some embodiments, the present invention is used to deposit a perovskite material with a suitable and complementary band gap would enable a broader spectral response of existing semiconductor photovoltaics, for example deposition of $CH_3NH_3PbI_3$ as a topcell on silicon to form a tandem junction.

The present invention also relates to one or more optoelectronic device including a photoactive layer formed using a process according to the present invention. The present invention also relates to one or more photoactive devices which include a photoactive layer formed using a process according to the present invention. The optoelectronic device can comprise a large range of photoactive devices such as photoelectric, photovoltaic and the like devices, including but not limited photovoltaic cells, photoactive sensors, including photodetectors, or the like.

An optoelectronic device according the present invention could therefore comprise a photoactive device, such as a photovoltaic cell, a photoactive sensor or a light emitting device. In some embodiments, the optoelectronic device can be selected from a photodiode; a phototransistor; a photomultiplier; a photo resistor; a photo detector; a light-sensitive detector; solid-state triode; a battery electrode; a light emitting device; a light emitting diode; a transistor; a solar cell; a laser; and a diode injection laser.

The optoelectronic device can have any suitable construction which incorporates a photoactive layer formed using a process according to the present invention. A second aspect of the present invention provides an optoelectronic device including a photoactive region which comprises:

a n-type region comprising at least one n-type layer;

a p-type region comprising at least one p-type layer; and a photoactive layer formed by a process according to the first aspect of the present invention disposed between the n-type region and the p-type region.

The photoactive layer comprises a thin film or planar layer. The perovskite layer comprising the photoactive layer is preferably in contact with the n-type region and the p-type region. More preferably, the comprising perovskite semiconductor layer forms a planar heterojunction with the n-type region or the p-type region of the optoelectronic device.

It should be understood that as used herein, the term "n-type region", refers to a region of one or more electron-transporting (i.e. n-type) materials. Similarly, the term "n-type layer" refers to a layer of an electron-transporting (i.e. an n-type) material. An electron-transporting (i.e. an n-type) material could be a single electron-transporting compound or elemental material, or a mixture of two or more electron-transporting compounds or elemental materials. An electron-transporting compound or elemental material may be undoped or doped with one or more dopant elements.

It should also be understood that as used herein, the term "p-type region", refers to a region of one or more hole-transporting (i.e. p-type) materials. Similarly, the term "p-type layer" refers to a layer of a hole-transporting (i.e. a p-type) material. A hole-transporting (i.e. a p-type) material could be a single hole-transporting compound or elemental material, or a mixture of two or more hole-transporting compounds or elemental materials. A hole-transporting compound or elemental material may be undoped or doped with one or more dopant elements.

The p-type region preferably comprises a p-type layer and a p-type exciton blocking layer. In some embodiments, the p-type exciton blocking layer is disposed between the p-type layer and the photoactive layer.

A third aspect of the present invention provides an optoelectronic device comprising:

a negative electrode comprising a current collector and a negative electrode material;

a positive counter electrode comprising a current collector and a positive electrode material; and a charge transporting material between the positive electrode and negative electrode;

wherein one or both of the positive electrode material and negative electrode material comprises a composite electrode material comprising:

a conductive substrate;

an electrode-screening layer; and a photoactive layer formed by a process according to the first aspect of the present invention.

It should be appreciated that the optoelectronic device can further include an external casing.

The electrode-screening layer preferably comprises at least one hole blocking layer; or at least one electron blocking layer. Furthermore, the photoactive layer preferably comprises one or more ordered perovskite semiconductor(s) as the photoactive material responsible for light absorption and charge transport that result in photon to electrical power conversion.

The perovskite layer preferably forms a planar heterojunction with the adjoining n-type region or the p-type region. Either the n-type region or the p-type region may be disposed on the perovskite layer. In some embodiments, the perovskite layer is in contact with both the n-type region and the p-type region. Thus, the perovskite layer may form planar heterojunctions with both the n-type and p-type regions on either side of the layer. Accordingly, in some embodiments of the optoelectronic device of the invention, the perovskite layer forms a first planar heterojunction with the n-type region and a second planar heterojunction with the p-type region.

The term "semiconductor" as used herein refers to a material with electrical conductivity intermediate in magnitude between that of a conductor and a dielectric. A semiconductor may be an n-type semiconductor, a p-type semiconductor or an intrinsic semiconductor.

The photoactive layer formed in the process of the present invention typically forms part of a thin film optoelectronic and/or photoactive device. The first precursor coating has a dry layer thickness from 10 to 500 nm. In some embodiments, the thickness can be from 100 to 400 nm, more preferably from 200 to 400 nm, and yet more preferably about 300 nm. The resulting thickness of the perovskite layer is preferably from 50 nm to 10 μm. More typically, the thickness of the perovskite layer is from 100 nm to 5 μm. Preferably, the thickness of the perovskite layer is from 200 nm to 1000 nm, for instance from 100 nm to 700 nm. In some embodiments, the thickness of the perovskite layer is often greater than 100 nm. The thickness may for example be from 100 nm to 100 μm, or for instance from 300 nm to 700 nm.

In some embodiments, further additives can be used to improve processability of photoactive layer of a planar perovskite photoactive device. In some embodiments, at least one of the first perovskite precursor solution or the second precursor solution further comprises a perovskite crystallisation retardant in the form of a polymer additive which is soluble in the respective first coating solvent or second coating solvent. In these embodiments, an additional polymeric crystallisation retardant is used. In these sequential type coatings, once the layers are applied $MX_2$ and AX react to form $AMX_3$, and then the polymer additive acts as a crystallisation retardant to the subsequent crystallisation of the $AMX_3$ perovskite layer.

Without wishing to be limited to any one theory, the Applicant considers that a polymer can provide an additional advantageous crystallisation retardant as it provides a long chain molecule within the crystal structure. The long chains of the polymer provide surprisingly effective retardation effect on the crystallisation rate of the perovskite precursor that only a small amount of polymer needs to be added to the solution to retard the crystallisation rate of the perovskite precursor solution a sufficient amount to enable a substantially uniform layer to be formed. A small amount of impurity within the perovskite layer is also preferable so as to not interfere with the electro-active properties of that layer. Additionally, the small concentration can in some embodiments facilitate removal of the polymer without substantial effect on the formed or forming crystal structure.

The various layers can be applied in single or multiple coatings and/or layers. For example, in some embodiments, the polymeric crystallisation retardant can be applied to the substrate, followed by a layer of $MX_2$, subsequently followed by a coating/layer of AX. In other embodiments, one layer of a $MX_2$ and polymeric crystallisation retardant are applied as a mixture. In a preferred embodiment the applied coating comprises:

applying a layer of $MX_2$ with AX and a crystallisation retardant comprising a polymer additive mixture onto the substrate, wherein the ratio of $MX_2$:AX=1:n in which 0<n<1; and coating at least one layer of AX onto the $MX_2$ with AX and polymer additive mixture layer.

As the perovskite layer is electro-active, a non-electroactive or insulating polymer is preferred. The selected polymer additive must also be soluble in a polar aprotic solvent, preferably a highly polar aprotic solvent. Suitable solvents include, but should not be limited to, at least one of DMF, DMSO, γ-butyrolactone (GBL), acetone, THF, acetyl acetone, ethyl acetoacetate or combinations thereof.

A large number of polymers additives can be used in the present invention as the crystallisation retardant. In some embodiments, the polymer is selected from the group consisting of poly vinyl alcohol, poly vinyl acetate (PVAc), ABS, poly amides, poly acrylics, poly imide, poly acrylonitrile, poly butyl methacrylate, poly butadiene, poly carboxy methyl cellulose, poly ethers, poly ethylene acrylates, poly glycols, poly isocyanates, poly methacrylates, poly vinyl butyral, poly vinyl fluoride, poly vinyl methyl ethers, poly amines, polyethylene oxide, polyethylene glycol, Poly (2-ethyl-2-oxazoline) and combinations thereof. In some embodiments, the polymer comprises polyethylene oxide. In other embodiments, the polymer comprises Poly(2-ethyl-2-oxazoline) (PEOXA). In a preferred embodiment, the polymer additive comprises poly vinyl acetate, polyethylene glycol or combinations thereof. In another embodiment, the polymer comprises a poly amine or a hydrochloride salt thereof, such as polyethyleneimine, polyallylamine, a hydrochloride salt thereof or combinations thereof. However, it should be appreciated that other polymers may also be used in the process of the present invention.

As noted previously, the long chain structure of a polymer chain is able to effectively interfere with crystal formation of the perovskite structure. Accordingly, the addition of very small amount of a suitable polymer additive can dramatically improve the processability of perovskite solution. In some embodiments, the polymer additive comprises from 0.01 to 20 wt % of perovskite precursor. However, the polymer addition can preferably comprise from 0.05 to 18 wt % of perovskite precursor, more preferably from 0.05 to 15 wt %, yet more preferably from 0.1 to 10 wt %, even more preferably from 0.1 to 5 wt %, yet more preferably from 0.1 to 2 wt % of perovskite precursor. In one embodiment, the polymer additive comprises about 1.5 wt % of perovskite precursor.

In those embodiments in which a polymer additive is used, the photoactive coat of the present invention can function with or without the polymer additive present within the final form of the layer. In some embodiments, it can be preferable to remove the polymer additive as it can act as an impurity which affects the function of the photoactive layer. Therefore, some embodiments of the process include the further step of removing the polymer additive from the applied coating. This removal step can occur before, during or after the drying and/or crystallisation process of the photoactive layer. In some embodiments, the step of removing the polymer additive preferably occurs after the applied coating has dried.

The polymer additive can be removed using a number of different methods. In some embodiments, the step of removing the polymer additive includes washing the substrate and applied coating in a removal solvent. The removal solvent can comprise any suitable solvent. However, it is preferred for the removal solvent to be less polar than the coating solvent. Non limiting examples of suitable solvents include 2-propanol or chloroform.

In other embodiments, the polymer additive comprises a UV breakable polymer and the step of removing the polymer additive includes degrading the polymer additive using UV irradiation, preferably as a gas or volatile small molecule.

In the present sequential type coatings method, the polymer additive can be removed either after the perovskite layer has crystallised or after the first layer (the $MX_2$ and polymer additive coating) has been applied, or while AX is reacting with $MX_2$. These options include solvent washing can be used on the $MX_2$ and polymer additive coating before or after coating of the AX solution, and use of a UV breakable polymer, enabling the polymer additive to be converted to gas or volatile small molecule by UV irradiation before or after application of AX coat over the prior $MX_2$ and polymer additive coating. In other embodiments, the polymer additive is removed from the applied coating while AX reacts with $MX_2$ to form $AMX_3$. In this process, the polymer additive is preferably removed during a dipping process when $MX_2$ is applied to the previously applied coating layer which includes $MX_2$.

The present invention also relates to one or more photoactive devices which include a photoactive layer formed using a process according to the present invention. The photoactive device can comprise a large range of photoelectric, photovoltaic and the like devices including but not limited photovoltaic cells, photoactive sensors, including photodetectors, or the like.

BRIEF DESCRIPTION OF THE FIGURES

The present invention will now be described with reference to the figures of the accompanying drawings, which illustrate particular preferred embodiments of the present invention, wherein:

FIG. 1 provides an illustration of the layers comprising a solar cell incorporating a photoactive layer according to the present invention in (A) a conventional solar cell structure; and (B) an inverted solar cell structure; (C) a tandem solar cell structure.

FIG. 2 provides a schematic illustration of slot die coating with a gas-quenching process for the fabrication of pinhole-free first precursor solution ($MX_2$ plus AX additive) layer showing (A) Overall printer schematic; and (B) Slot die printing head schematic.

FIG. 9b shows a photograph of an intermediate and perovskite during the same roll-to-roll process shown in FIG. 9a.

DETAILED DESCRIPTION

Figure 3:
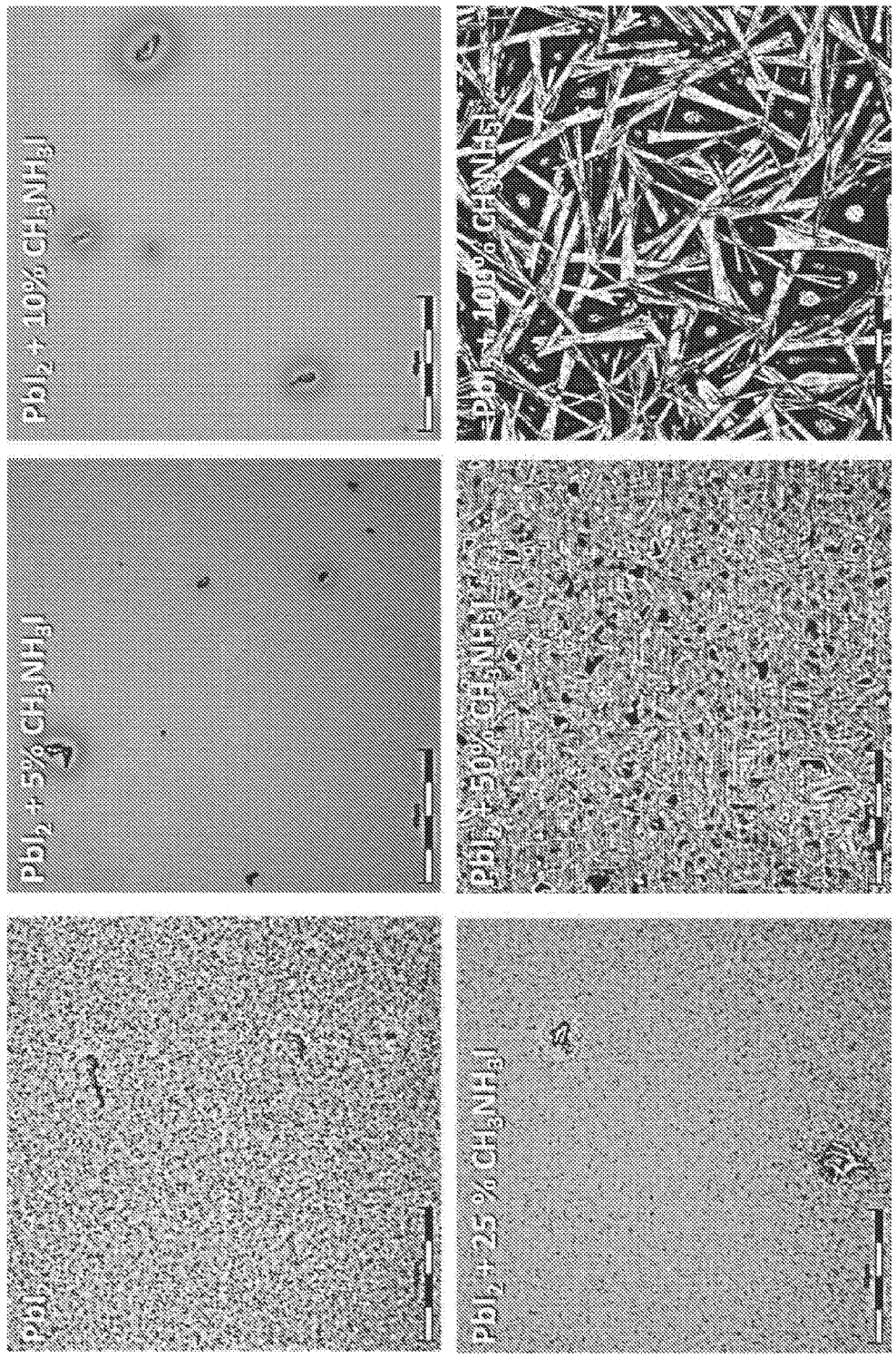
FIG. 3 provides six optical microscope images of $PbI_2$ and a series of $PbI_2$ plus different % composition $CH_3NH_3I$ films prepared by slot die coating and dried naturally at room temperature.

Photovoltaic cells, particularly thin film and flexible solar cells are formed as a multilayer coating on a substrate. As shown in FIG. 1, this multilayer coating structure can be arranged on the substrate in at least two different arrangements termed in the art as (A) a conventional structure, or (B) as an inverted structure (FIG. 1(B)).

As shown in FIG. 1(A), a conventional structure is formed on a substrate having the following layers successively layered on a surface thereof: a transparent conductor (such as a transparent conductive oxide (TCO), conducting polymer or thin metal) with or without conducting grids, followed by a hole transporting layer; followed by the photoactive layer; followed by an electron transporting layer, and followed by a conductor layer (typically a metal).

As shown in FIG. 1(B), an inverted structure is formed on a substrate having the following layers successively layered on a surface thereof: a transparent conductor (such as a transparent conductive oxide (TCO), conducting polymer or thin metal) with or without conducting grids, followed by an electron transporting layer; followed by the photoactive layer; followed by a hole transporting layer, and followed by a conductor layer (typically a metal).

It should be appreciated that the hole transporting layer or electron transporting layers could be omitted in some embodiments of the above conventional and inverted structures. These layers can therefore be optional in certain embodiments.

As shown in FIG. 1(C), a tandem structure is formed on a substrate using two stacked solar cell structures, i.e. a top cell and a bottom cell of the conventional or inverted structure. The stacked structure includes two different solar cell of the same or different configurations. The example provided comprises the following layers successively layered thereon: Transparent conductor layer (TCO, conducting polymer or thin metal) with or without collecting grids; followed by a Top cell—a Perovskite solar cell either type A (FIG. 1A) or type B (FIG. 1B); followed by a Transparent conductor layer (TCO, conducting polymer or thin metal) with or without conducting grids; followed by a Bottom cell (perovskite, organic, inorganic or silicon solar cell); followed by a Metal (or conductor) layer. A substrate such as glass, plastic, metal or ceramic could also be used but should be understood to be optional. Tandem and multilayer/junction structures will be discussed in more detail below.

Each layer can be formed by one of a number of coating techniques know in the art including casting, doctor blading, screen printing, inkjet printing, pad printing, knife coating, meniscus coating, slot die coating, gravure coating, reverse gravure coating, kiss coating, micro-roll coating, curtain coating, slide coating, spray coating, flexographic printing, offset printing, rotatory screen printing, or dip coating. It should be appreciated that a person skilled in the art would be able to adopt a suitable technique to apply each layer based on techniques known in the art.

The various layers can comprise a number of suitable components currently known in the art. Examples include:

Suitable transparent conductive oxides (TCO) include tin doped indium oxide (ITO), fluoride-doped tin oxide (FTO), doped zinc oxide such as aluminium doped zinc oxide (AZO), or indium doped cadmium-oxide;

Suitable hole transporting layers include a transparent conducting polymer such as at least one of Poly(3,4-ethylenedioxythiophene) (PEDOT), poly(3,4-ethylenedioxythiophene) and polystyrene sulfonate mixture (PEDOT:PSS), poly(4,4-dioctylcyclopentadithiophene); doped P3HT (Poly(3-hexylthiophene-2,5-diyl)) or the like;

Suitable electron transporting layers include zinc oxide, titanium dioxide, tungsten trioxide or the like;

Suitable conductor layers comprise aluminium, silver, magnesium, copper, gold or suitable alloys thereof or the like; and Suitable substrates include metals, polymers, ceramics, or glasses.

In a perovskite type photoactive device, such as a photovoltaic cell, the photoactive layer comprises an organic-inorganic perovskite-structured semiconductor.

The skilled person will appreciate that a perovskite material can be represented by the formula [A][M][X]$_3$, wherein [A] is at least one cation, [M] is at least one cation and [X] is at least one anion. When the perovskite comprise more than one A cation, the different A cations may distributed over the A sites in an ordered or disordered way. When the perovskite comprises more than one M cation, the different M cations may distributed over the M sites in an ordered or disordered way. When the perovskite comprise more than one X anion, the different X anions may be distributed over the X sites in an ordered or disordered way. The symmetry of a perovskite comprising more than one A cation, more than one M cation or more than one X cation, will be lower than that of $CaTiO_3$. A perovskite is a crystalline compound. Thus, the layer of the perovskite semiconductor without open porosity typically consists essentially of crystallites of the perovskite.

As mentioned in the preceding paragraph, the term "perovskite", as used herein, refers to (a) a material with a three-dimensional crystal structure related to that of $CaTiO_3$ or (b) a material comprising a layer of material, wherein the layer has a structure related to that of $CaTiO_3$. Although both of these categories of perovskite may be used in the devices according to the invention, it is preferable in some circumstances to use a perovskite of the first category, (a), i.e. a perovskite having a three-dimensional (3D) crystal structure. Such perovskites typically comprise a 3D network of perovskite unit cells without any separation between layers. Perovskites of the second category, (b), on the other hand, include perovskites having a two-dimensional (2D) layered structure. Perovskites having a 2D layered structure may comprise layers of perovskite unit cells that are separated by (intercalated) molecules; an example of such a 2D layered perovskite is [2-(I-cyclohexenyl)ethylammonium]2PbBr$_4$. 2D layered perovskites tend to have high exciton binding energies, which favours the generation of bound electron-hole pairs (excitons), rather than free charge carriers, under photoexcitation. The bound electron-hole pairs may not be sufficiently mobile to reach the p-type or n-type contact where they can then transfer (ionise) and generate free charge. Consequently, in order to generate free charge, the exciton binding energy has to be overcome, which represents an energetic cost to the charge generation process and results in a lower voltage in a photovoltaic cell and a lower efficiency. In contrast, perovskites having a 3D crystal structure tend to have much lower exciton binding energies (on the order of thermal energy) and can therefore generate free carriers directly following photoexcitation. Accordingly, the perovskite semiconductor employed in the devices and processes of the present invention is preferably a perovskite of the first category, (a), i.e. a perovskite which has a three-dimensional crystal structure. This is particularly preferable when the optoelectronic device is a photovoltaic device.

In order to provide highly efficient photovoltaic devices, the absorption of the absorber/photoactive region should ideally be maximised so as to generate an optimal amount of current. Consequently, when using a perovskite as the absorber in a solar cell, the thickness of the perovskite layer should ideally be in the order of from 300 to 600 nm, in order to absorb most of the sun light across the visible spectrum. In particular, in a solar cell the perovskite layer should generally be thicker than the absorption depth (which is defined as the thickness of film required to absorb 90% of the incident light of a given wavelength, which for the perovskite materials of interest is typically above 100 nm if significant light absorption is required across the whole visible spectrum (400 to 800 nm)), as the use of a photoactive layer in photovoltaic devices with a thickness of less than 100 nm can be detrimental to the performance of the device.

In contrast, electroluminescent (light-emitting) devices do not need to absorb light and are therefore not constrained by the absorption depth. Moreover, in practice the p-type and n-type contacts of electroluminescent devices are typically chosen such that once an electron or hole is injected on one side of the device it will not flow out of the other (i.e. they are selected so as to only inject or collect a single carrier), irrespective of the thickness of the photoactive layer. In essence, the charge carriers are blocked from transferring out of the photoactive region and will thereby be available to recombine and generate photons, and can therefore make use of a photoactive region that is significantly thinner.

As used herein, the term "thickness" refers to the average thickness of a component of an optoelectronic device. Typically, therefore, when the optoelectronic device is a photovoltaic device, the thickness of the perovskite layer is greater than 100 nm. The thickness of the perovskite layer in the photovoltaic device may for instance be from 100 nm to 100 µm, or for instance from 100 nm to 700 nm. The thickness of the perovskite layer in the photovoltaic device may for instance be from 200 nm to 100 µm, or for instance from 200 nm to 700 nm.

The present invention provides a process of forming a photoactive layer of a perovskite type photoactive device. There are currently two methods streams of forming perovskite layers on a substrate.

One stream is using conventional blend solution of $MX_2$ and AX in either a stoichiometric ratio ($MX_2$:AX=1:1) or non-stoichiometric ratios ($MX_2$:AX=1:n, n>1). AX is typically volatile so that excess amount can be removed by thermal annealing process. Various methods have been developed to fabricate defect free perovskite films The second stream is a two-step process, called sequential deposition process. $MX_2$ is easier to form defect free film compared to the $AMX_3$. Therefore, the process consists of coating of $MX_2$ followed by conversion process to $AMX_3$. In many cases, a precursor solution comprising AX is applied by dipping, slot die coating or other process to the first $MX_2$ coating for this conversion. Unfortunately, the conversion speed of dense $MX_2$ films can be very slow. Therefore, additional soaking processes can be used to create sub-micro-size cracks which allows AX to penetrate into $MX_2$ as for example is taught in Hwang et al, Toward Large Scale Roll-to-Roll Production of Fully Printed Perovskite Solar Cells DOI: 10.1002/adma.201404598 the contents of which are to be understood to be incorporated into this specification by this reference. The gas quenched and soaked $PbI_2$ show significantly faster reaction speeds and darker appearance after completion of the conversion as compared to conventionally formed $MX_2$ films which are converted by dipping or slot die processes.

A further process, the three step process is taught in Zhao Y. et al., "Three-step sequential solution deposition of $PbI_2$-free $CH_3NH_3PbI_3$ perovskite", Journal of Materials Chemistry A, 3, pages 9086-9091, 26 Nov. 2014 the contents of which are to be understood to be incorporated into this specification by this reference. Zhao Y. et al. teaches a three-step sequential solution process for complete conversion of precursor to $CH_3NH_3PbI_3$ without $PbI_2$ residue. In this three-step method, a thermally unstable stoichiometric $PbI_2.CH_3NH_3Cl$ precursor film is first deposited on the mesoporous $TiO_2$ substrate, followed by thermal decomposition to form $PbI_2$, which is finally converted into $CH_3NH_3PbI_3$ by dipping in a regular isopropanol solution of $CH_3NH_3I$ at room temperature. In comparison to the two-step approach using similar processing conditions, the three-step method enables the formation of the $PbI_2$ film through the thermal decomposition of the $PbI_2.CH_3NH_3Cl$ precursor film. This facilitates a rapid conversion of $PbI_2$ to $CH_3NH_3PbI_3$ without any traceable residue $PbI_2$ in the final conversion step, leading to an improved device performance. It should be understood that this process used $CH_3NH_3Cl$ to produce porous $PbI_2$ for full conversion to $CH_3NH_3PbI_3$ without $PbI_2$ residue. This process does not improve processability nor retard perovskite crystallization during perovskite formation. The main focus of this three step process is to produce porous $PbI_2$ film for accelerated conversion in a physical route (in contrast to the chemical route of the present invention).

Due to the volatile nature of AX, equivalent or excess amount of AX compared to $MX_2$ have been widely used when forming a perovskite layer using a perovskite precursor solution (single step) or precursor solutions (sequential deposition process, including the prior two step and three step processes discussed above).

Furthermore, in Zhao the thermally unstable stoichiometric $PbI_2.CH_3NH_3Cl$ precursor film is first deposited on a high temperature sintered meso-porous $TiO_2$ structure. This is not a planar perovskite as provided by the present invention. In addition, in Zhao, a porous $PbI_2$ layer is created by eliminating Methylammonium chloride (MACl—$CH_3NH_3Cl$) via a heating process. MACl instead of Methylammonium iodide (MAI) because MACl is more volatile and easy to remove. MAI is then added to produce the requisite perovskite. In the present invention, compound AX from the first precursor solution (for example MAI) is included in step 1 to improve processability and is incorporated into the final perovskite layer $AMX_3$.

The process of the present invention comprises the sequential coating or deposition sequential deposition of forming a perovskite layer. In the inventive process, a first coating of a first perovskite precursor solution comprising a metal halide ($MX_2$) component mixed with an AX additive in a first coating solvent is applied (in which the molar ratio of $MX_2$:AX=1:n with 0<n<1), then a second coating of a second precursor solution comprising an ammonium halide or other organic halide reactant (AX) in a second coating solvent which forms to the selected perovskite precursor is applied. Once the layer of AX is applied to the initial $MX_2$ coating, $MX_2$ and AX react to form $AMX_3$. Importantly, the amount of AX additive in the first precursor solution is less than the stoichiometric required for the reaction with $MX_2$ to form the perovskite crystals to $AMX_3$, i.e. a molar ratio of $MX_2$:AX=1:n with 0<n<1. However, it should be appreciate that the exact molar ratio is dependent on the nature of the components $MX_2$ and AX and can vary accordingly.

Thus, despite conventional wisdom of using equivalent or excess amount of AX compared to $MX_2$ as taught in all previous methods including Zhao Y. et al., the inventors have surprisingly discovered that the addition of a less than stoichiometric amount (i.e. greater than 0 but less than 1) of AX to $MX_2$ in the first precursor solution applied to the substrate interferes with the crystallization of the perovskite layer in the sequential deposition process. Whilst a number of additives have been previously mixed with $MX_2$ in an attempt to control crystallisation, the use of AX in the first precursor solution advantageously does not contaminate the perovskite composition, as this additive is a reactant added in the second step.

No prior process has used a precursor solution having a lower than 1 molar ratio of AX in $MX_2$. In this regard, no previous research or process has discovered the advantages of the present invention that the addition of a less than stoichiometric amount (i.e. greater than 0 but less than 1) of AX to $MX_2$ in the first precursor solution applied to the substrate interferes with the crystallization of the perovskite layer in the sequential deposition process.

Any number of coating application techniques can be used to apply the first precursor solution and the second precursor solution to the substrate. The applied coatings of the first precursor solution and the second precursor solution can be applied by any number of suitable application techniques as discussed previously. In exemplary embodiments and as discussed in the following examples, the first precursor solution is applied using a slot die technique. The second precursor solution is the applied using either a dipping process or another technique, for example slot die coating. In some embodiments, the first precursor solution and the second precursor solution is applied using a slot die technique. An example of one type of slot die coating process and device is shown in FIG. 2. This is described in more detail below. It should be appreciated that other slot die coating devices and process are equally applicable for applying a coating of the first precursor solution and/or second precursor solution to a substrate, and that the present invention should not be limited to the illustrated device.

As demonstrated in some of the following examples, the process of the present invention can further include the step of drying the applied coating of the first precursor solution and/or the second precursor solution. The drying step can comprise any number of drying process including air dry, convective drying, ambient drying, heat treatment, annealing or the like at a temperature suitable for the perovskite layer to crystallise. In some embodiments, each layer is air dried. In other embodiments, convective or forced drying techniques are used. In some embodiments, heat can be applied to encourage evaporation of the respective first coating solvent or second coating solvent.

In some embodiments, as will be demonstrated in some of the following examples, a gas-quenching technique is used to rapidly dry the respective coating layer of first or second precursor solution. Gas-quenching comprising the rapid cooling and drying of the applied coating or the first and/or second precursor solution through the application of a drying gas, such as nitrogen, argon or other inert gas. Slot die coating followed by gas quenching has been found to provide a dense and uniform film which can be converted to perovskite film following application of the second precursor solution.

As mentioned previously, FIG. 2 provides an example of one type of slot die printing device which can be used to coat the substrate with the first precursor solution and/or the second precursor solution in accordance with the process of the present invention. The set up shown in FIG. 2 can also be used for the gas quenching process described above. In this set up, a modified 3D printer based slot-die coater 100 is used for coating purposes, for example as is taught in D. Vak, et al "3D Printer Based Slot-Die Coater as a Lab-to-Fab Translation Tool for Solution-Processed Solar Cells", Adv. Energy Mater. 2014, DOI: 10.1002/aenm.201401539, the disclosure of which should be understood to be incorporated into this specification by this reference. The 3D printer 100 (FIG. 2(A)) comprises a hot plastic extrusion 3D printer (Felix 2.0) which is adapted to actuate a syringe of precursor solution to feed this solution through a slot die printing head 101 (FIG. 2(B)) including a slot nozzle 105. The slot printing head 101 includes a stepper motor (a generic NEMA 17 stepper motor with a dual shaft—not illustrated) and components to convert rotation to linear translation and an integrated syringe pump (not illustrated) to feed solution directly from syringe to nozzle without any tubes. The stepper motor is controlled to rotate a feeding screw in the syringe pump to dispense fluid through the slot nozzle 105. This type of 3D printer can control the xyz positions with acceleration and speed control. The temperature of the nozzle 100 and the bed can also be controlled. For gas quenching, the printing head 101 comprises a first slot die head 102 and a second gas quenching head 104 connected to high-pressure nitrogen to quickly dry the applied first precursor solution. The order of the heads 102 and 104 ensures that the nitrogen quenching gas is applied to the first precursor solution (or second precursor solution) immediately after application to the substrate when the slot printing head 101 is moving in printing direction D (arrow D in FIG. 2(B)). It should be noted that unlike conventional slot-die coating, curved stripes could be also prepared using the illustrated modified 3D printing set up 100. This demonstrates another advantage of the 3D printing platform—photoactive cells with nonconventional designs can be fabricated.

In some embodiments, as will be demonstrated in some of the following examples, the coating layer formed by the first precursor solution ($MX_2$ coating layer) after the first deposition step of the process of the present invention can be converted to a more reactive form by using a solvent vapour soaking technique. This technique can be particularly effective, if used after the first precursor solution is rapidly dried, for example using a gas quenching technique (discussed above). Solvent vapour soaking process comprises storing the wet $MX_2$ coating layer in an enclosure, preferably a small enclosure as soon as the $MX_2$ coating is applied to the substrate, or where gas quenching is used, following gas quenching step. This additional solvent vapour soaking technique can create micro-size cracks in the $MX_2$ coating layer which allow AX to penetrate into $MX_2$. Whilst not wishing to be limited to any one theory, the Inventors consider that during solvent vapour soaking, a gas-quenched first precursor solution ($MX_2$) layer formed a dense, dried skin on the film, which trapped solvent inside. Therefore, the trapped solvent resulted in mobile ions that could form small crystals. Gas quenching assists in removing this solvent. Overall, solvent vapour soaking $MX_2$ coating layers shows a much faster conversion to perovskite after application of the second precursor solution as compared to non-solvent vapour soaking samples.

The perovskite precursor solutions can include additional additives. For example, in one at least one of the first perovskite precursor solution or the second precursor solution further comprises a polymer additive which is soluble in the respective first coating solvent or second coating solvent. Here the polymer acts as an additional crystallisation retardant in the perovskite crystallisation process. The Applicant expects that the use of an additional polymer crystallisation retardant may assist in the formation of defect free perovskite layers. The use of polymers as a crystallisation retardant in the perovskite crystallisation process is described in detail in the Applicant's pending international patent application No. PCT/AU2015/000100, published as WO2015127494A1 the disclosure of which should be understood to be incorporated into this specification by this reference. As discussed above and in WO2015127494A1 a large number of polymers additives can be used in the present invention. In some embodiments, the polymer is selected from the group consisting of poly vinyl alcohol, poly vinyl acetate (PVAc), ABS, poly amides, poly acrylics, poly imide, poly acrylonitrile, poly butyl methacrylate, poly butadiene, poly carboxy methyl cellulose, poly ethers, poly ethylene acrylates, poly glycols, poly isocyanates, poly methacrylates, poly vinyl butyral, poly vinyl fluoride, poly vinyl methyl ethers, poly amines, polyethylene oxide, polyethylene glycol, Poly(2-ethyl-2-oxazoline) and combinations thereof. In some embodiments, the polymer comprises polyethylene oxide. In other embodiments, the polymer comprises Poly(2-ethyl-2-oxazoline) (PEOXA). In a preferred embodiment, the polymer additive comprises poly vinyl acetate, polyethylene glycol or combinations thereof.

In another embodiment, the polymer comprises a poly amine or a hydrochloride salt thereof, such as polyethyleneimine, polyallylamine, a hydrochloride salt thereof or combinations thereof.

As discussed previously, the perovskite precursor solutions can be used to form a large number of different perovskite layers in accordance with the present invention. In an exemplary embodiments, illustrated in the following examples, the form perovskite layer comprises an organo-lead Iodide perovskite, preferably comprising at least one of $CH_3NH_3PbI_3$ or $HC(NH_2)_2PbI_3$. It should however be understood that the present invention is not limited to those specific components, but rather can comprise a wide range of components as covered above.

It should be appreciated that the photoactive layer of the present invention can be incorporated into the layered structure of a variety of optoelectronic and photoactive devices having both conventional and inverted structures discussed above. The photoactive layer of the present invention can also be incorporated into multijunction structures, for example tandem photoactive structures including two stacked layers of photoactive structures as discussed previously. A photoactive device such as a solar cell which includes the perovskite photoactive layer of the present invention could be one or both of the bottom cell or top cell of a tandem device. In some embodiments, the other solar cell could comprise any other type of photoactive cell including organic solar cells and even other perovskite solar cells. For example, a device structure could comprise one of:

Glass/TCO/ETL/perovskite I/HTL/TCO/ETL/perovskite II/HTL/metal electrode; or

PET/organic solar cell (TCO/ZnO/P3HT:PCBM/PEDOT:PSS)/ETL/perovskite/HTL/metal electrode.

EXAMPLES

Example 1—$MX_2$ Coating/Layer Morphology

Photoactive Layer Fabrication:

ITO-coated glass (Shenzhen Display, 5Ω sq$^{-1}$) was successively sonicated for 5 min each in Deconex 12PA detergent solution, distilled water, acetone and 2-propanol. The substrates were then exposed to UV-ozone (Novascan PDS-UVT) cleaning at room temperature for 15 min. For the electron transporting layer, ZnO nanoparticle solution (20 mg/ml in ethanol) was coated onto ITO glass using a slot die head with 50 μm shim and 200 μm-thick meniscus guide at 3 mm/s coating speed and 1 μL/cm$^2$ solution feed. The shim with 13 mm channel was used with the same width of meniscus guide, and the gap between the meniscus guide and the substrate was fixed at 100 μm. The ZnO films were then annealed at 120° C. for 10 min in air.

For the perovskite layer, a $PbI_2$ (99%, Sigma-Aldrich) precursor solution (0.7 M, 322 mg/mL) in N,N-dimethylformamide was prepared by stirring at 70° C. for 1 hr in air. Various amount of $CH_3NH_3I$ was added based on molar ratio. The solutions were transferred to the slot die head without filtration.

The first layer ($PbI_2$ solution) was applied using a slot die coating (without gas quenching), as shown and described in relation to FIG. 2 and taught in Hwang et al, Toward Large Scale Roll-to-Roll Production of Fully Printed Perovskite Solar Cells DOI: 10.1002/adma.201404598 and D. Vak, K. Hwang, A. Faulks, Y.-S. Jung, N. Clark, D.-Y. Kim, G. J. Wilson, S. E. Watkins, Adv. Energy Mater. 2014, DOI: 10.1002/aenm.201401539, again the contents of which are to be understood to be incorporated into this specification by this reference. A range of different $PbI_2$ solution compositions were applied with and without an $AX(CH_3NH_3I)$ additive, including (A) $PbI_2$ solution (no AX); (B) $PbI_2$ with 5% $CH_3NH_3I$; (C) $PbI_2$ with 10% $CH_3NH_3I$; (D) $PbI_2$ with 25% $CH_3NH_3I$; (E) $PbI_2$ with 50% $CH_3NH_3I$; (F) $PbI_2$ with 100% $CH_3NH_3I$ (i.e. stoichiometric concentrations). For these experiments a 200 μm gap between a meniscus guide and the substrate was used to maximize the wet film thickness. Coating was carried out at speed of 5 mm/s with 1 μL/cm$^2$ solution feed. The wet film was then dried naturally at room temperature. Samples were kept in air for more than 10 min or instantly transferred to an enclosed sample carrier and kept in the carrier for 10 min. Optical microscope images were taken of each layer as shown in FIG. 3.

Results

FIG. 3 provides optical microscope images of the various $MX_2$ ($PbI_2$) and $MX_2$ with various amount of AX films prepared. FIG. 3 clearly shows effect of AX additive in $MX_2$ solution. Pure $PbI_2$ film prepared by same process showed micron size pinholes. With small amount of $AX(CH_3NH_3I)$, film is more defect free. No pinhole is found in $PbI_2$ with 5-10% $CH_3NH_3I$ films even without using a gas quenching process to rapidly dry the $PbI_2$ layer once applied.

With non-stoichiometric amount of AX, the films can have more amorphous phase as it is difficult to form either $MX_2$ or $AMX_3$ crystal. Amorphous phase is thermodynamically less favourable compared to crystal from. This indications that the a $PbI_2$ film can be more easily converted to perovskite crystal in dipping process due to more thermodynamic driving force.

Example 2—Perovskite Formation Reaction Speed

Photoactive Layer Fabrication:

The perovskite photoactive layers were fabricated using a similar methodology as set out in Example 1. However, here the range of different $PbI_2$ solution compositions were applied with and without an $AX(CH_3NH_3I)$ additive, comprises (A) $PbI_2$ solution (no $CH_3NH_3I$); (B) $PbI_2$ with 30% $CH_3NH_3I$.

$CH_3NH_3I$ solution (10 mg/mL) in 2-propanol was prepared for perovskite conversion. The $PbI_2$ layers were dipped into the $CH_3NH_3I$ solution for 3 min, rinsed with 2-propanol before the film dried, and then the solvent was quickly removed by $N_2$ gas-blowing. The reaction speed of $PbI_2$ films without and with 30 mol % $CH_3NH_3I$ were tested by timing the formation of perovskite layer formation by monitoring absorbance change during conversion. A white LED was illuminated to a beaker with $CH_3NH_3I$ solution and light transmission through the beaker was monitored by a photodiode. $PbI_2$ films with and without an $AX(CH_3NH_3I)$ additive were dipped to the solution while monitoring absorbance as shown in FIG. 4.

Results

Figure 4:
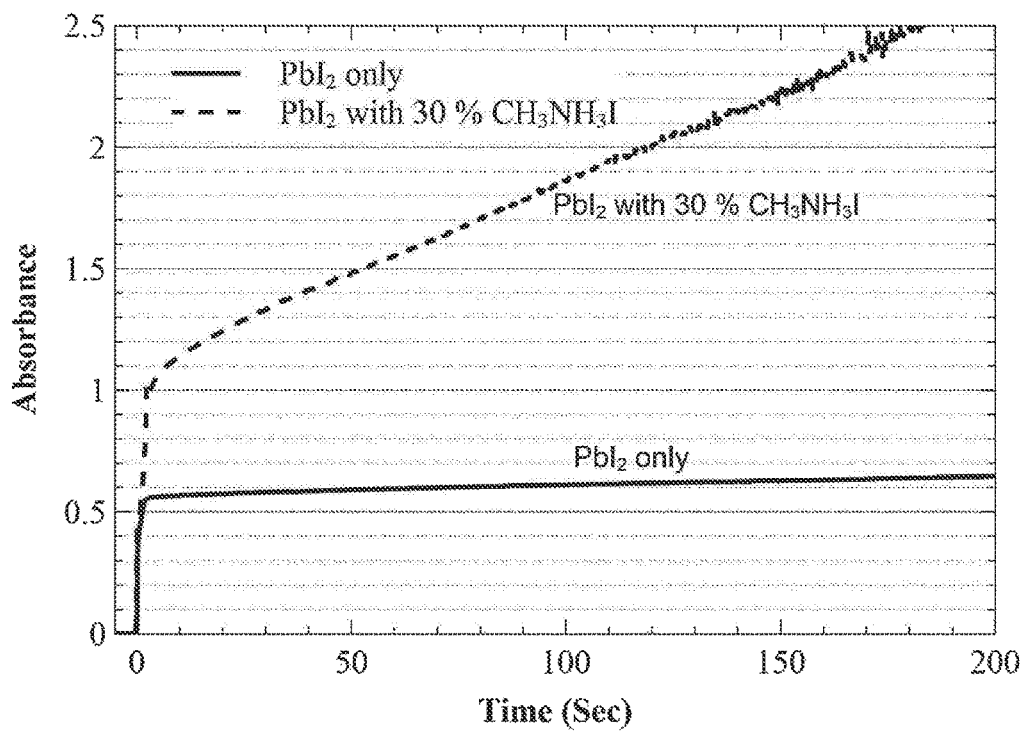
FIG. 4 is a plot of absorbance change during dipping process for conversion of $PbI_2$ with and without $CH_3NH_3I$ additive to perovskite.

The results of the reaction speed tests are shown in FIG. 4 which show absorbance change during dipping process for conversion of $PbI_2$ with and without $CH_3NH_3I$ additive to perovskite. The films having the $CH_3NH_3I$ additive were observed to have a very fast initial reaction. The initial increase was considered to be due to reaction on surface. Both the films ($PbI_2$ and $PbI_2$ with 30% $CH_3NH_3I$) showed very rapid increase at start. However, amount of change at the initial change is significantly different. After initial increase, the film with the additive also showed significantly faster absorbance increase and reached almost saturated absorbance.

Example 3—Slot Die Coated Perovskite Solar Cell Devices

Photoactive Layer Fabrication:

The perovskite photoactive layers were fabricated using a similar methodology as set out in Example 1. However, in this run the $PbI_2$ layers were fabricated by slot die coating with gas quenching as described in relation to FIG. 2 above and taught in Hwang et al, Toward Large Scale Roll-to-Roll Production of Fully Printed Perovskite Solar Cells DOI: 10.1002/adma.201404598 again, the contents of which are to be understood to be incorporated into this specification by this reference. Furthermore, in this experimental run, the $PbI_2$ layer were formed using four different techniques:

A). Slot die coated $PbI_2$ layer without $CH_3NH_3I$, air dried for 10 minutes;

B). Slot die coated $PbI_2$ layer without $CH_3NH_3I$, stored in a small chamber for solvent vapour soaking for 10 minutes;

C). Slot die coated $PbI_2$ layer with $CH_3NH_3I$, air dried for 10 minutes; and D). Slot die coated $PbI_2$ layer with $CH_3NH_3I$, stored in a small chamber for solvent vapour soaking for 10 minutes.

For B) and D) a solvent vapour soaking technique was used in the film was stored in a small enclosed sample carrier as soon as $PbI_2$ layer was coated. In presence of solvent vapour, ions in $Pb^{2+}$ and $I^-$ ions become mobile and can form thermodynamically stable crystal. The process also create sub-micro-size crack which allow $AX(CH_3NH_3I)$ to penetrate into PbI2 layer more rapidly and deeply. So full conversion can be done.

Device Fabrication

The perovskite layer formed on the coated substrates from Example 1 were coated with a hole transporting layer immediately after perovskite formation to minimize exposure to moisture. For the hole transporting layer, 1 mL of P3HT (Merck) solution (15 mg/mL in chlorobenzene), 6.8 µL of Li-bis(trifluoromethanesulfonyl) imide (28.3 mg/mL in acetonitrile) and 3.4 µL of 4-tert-butylpyridine were mixed, and then transferred to the slot die head without filtration. The solution was coated onto the perovskite film at 7 mm/s speed with 3 µL/cm² solution feed without thermal treatment, and the gap between the meniscus guide and the substrate was also fixed at 100 µm. It is noteworthy that all slot die coating processes were carried out in air. Temperature and relative humidity were typically 25 to 30° C. and 30 to 40%, respectively. For an evaporated electrode, the samples were carried to a vacuum evaporator and 100 nm of Ag was deposited through a shadow mask to produce a 10 mm² active area.

Results

Figure 5:
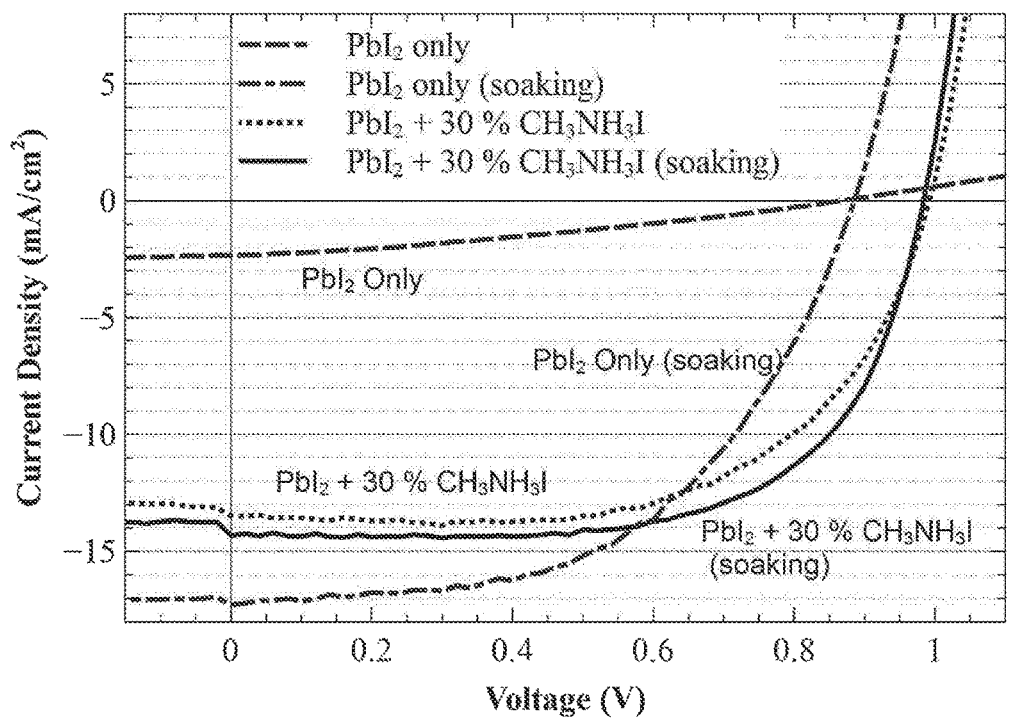
FIG. 5 provides output curves of four different perovskite solar cells with a device configuration of ITO/ZnO/perovskite ($CH_3NH_3PbI_3$)/doped P3HT/Ag fabricated by sequential deposition process.

The device results are shown in FIG. 5 which provide output curves of perovskite solar cells with a device configuration of ITO/ZnO/perovskite ($CH_3NH_3PbI_3$)/P3HT/Ag fabricated by sequential deposition process. As shown in this Figure, there was significant difference between perovskite layers fabricated from $PbI_2$ with and without soaking process. The vapour soaked films showed a much faster conversion to perovskite when it was dipped in MAI solution. In contrast, devices made from $PbI_2$ with the additive showed similar performance with about 9% of power conversion efficiency.

Example 4—Slot Die Coated Perovskite Solar Cells with Different Amount of $CH_3NH_3I$ Additive Photoactive Layer Fabrication:

The perovskite photoactive layers were fabricated using a similar methodology as set out in Example 1. However, in these experiments the range of different amount of $CH_3NH_3I$ was added to 0.7 M $PbI_2$ solution comprising (a) no additive; (b) 10 mol %; (c) 20 mol %; (d) 30 mol %; (e) 40 mol %. For these experiments a 200 µm gap between a meniscus guide and the substrate was used to maximize the wet film thickness. Coating was carried out at speed of 5 mm/s with 1 µL/cm² solution feed with gas quenching as described in relation to FIG. 2 above and as taught in Hwang et al (see Example 1). Films were kept in open environment, i.e. no soaking process to produce mesoporous $PbI_2$ film. $CH_3NH_3I$ solution (10 mg/mL) in 2-propanol was prepared for perovskite conversion. The $PbI_2$ layers were dipped into the $CH_3NH_3I$ solution for 3 min, rinsed with 2-propanol before the film dried, and then the solvent was quickly removed by $N_2$ gas-blowing.

Device Fabrication

The perovskite layer formed on the coated substrates was coated with a hole transporting layer immediately after perovskite formation to minimize exposure to moisture. For the hole transporting layer, 1 mL of P3HT (Merck) solution (15 mg/mL in chlorobenzene), 6.8 µL of Li-bis(trifluoromethanesulfonyl) imide (28.3 mg/mL in acetonitrile) and 3.4 µL of 4-tert-butylpyridine were mixed, and then transferred to the slot die head without filtration. The solution was coated onto the perovskite film at 7 mm/s speed with 3 µL/cm² solution feed without thermal treatment, and the gap between the meniscus guide and the substrate was also fixed at 100 µm. It is noteworthy that all slot die coating processes were carried out in air. Temperature and relative humidity were typically 25 to 30° C. and 30 to 40%, respectively. For an evaporated electrode, the samples were carried to a vacuum evaporator and 100 nm of Ag was deposited through a shadow mask to produce a 10 mm² active area.

Results

Figure 6:
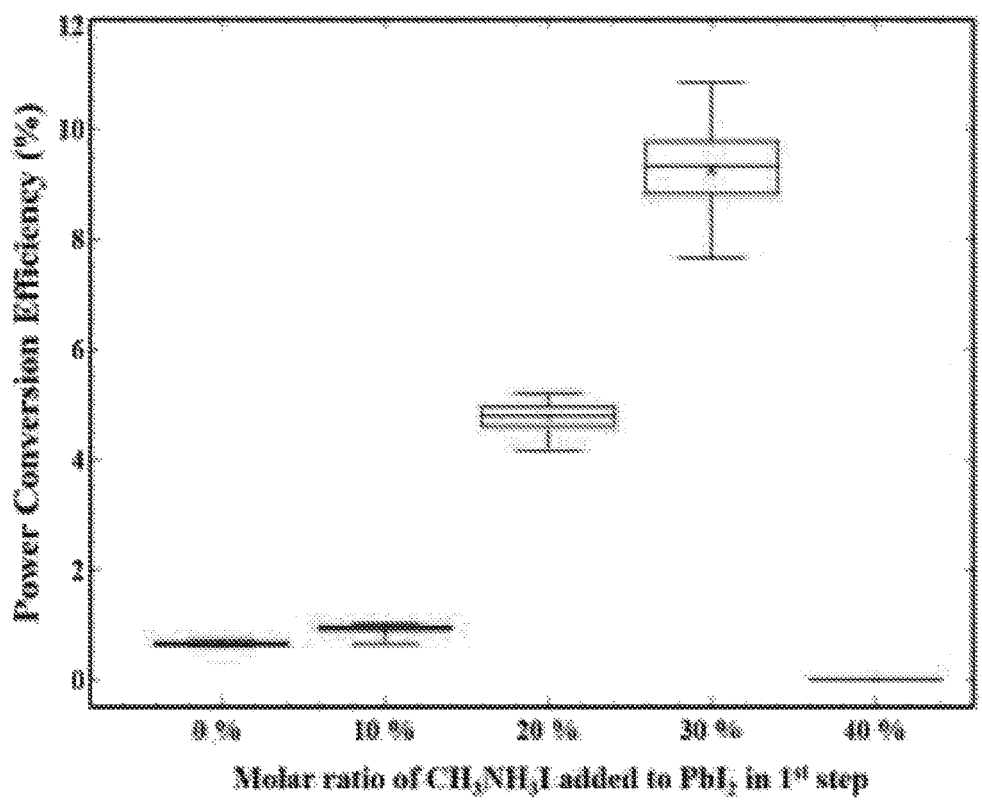
FIG. 6 provides a plot of power conversion efficiency versus molar ratio of $CH_2NH_3I$ added to $PbI_2$ showing the effect of MAI additive on performance of perovskite devices fabricated by same soaking-free procedure.

The device results are shown in FIG. 6 which provide average power conversion efficiency perovskite solar cells with a device configuration of ITO/ZnO/perovskite ($CH_3NH_3PbI_3$)/P3HT/Ag fabricated by sequential deposition process. As shown in FIG. 6, the effect of $CH_3NH_3I$ was significant. Devices made from pure $PbI_2$ with soaking process showed less than 1%. In contrast, devices with optimized amount of the additive showed power conversion efficiency over 10% which is similar to that of device via soaking process used in Hwang et al.

Example 5—Slot Die Coated Perovskite Solar Cells with Extra Additive

Photoactive Layer Fabrication:

The perovskite photoactive layers were fabricated using a similar methodology as set out in Example 1. However, here extra polymer additive was added to $PbI_2$ with 40 mol % $CH_3NH_3I$ to improve processability further as described above and also in the Applicants pending international patent application No. PCT/AU2015/000100, published as WO2015127494A1, the contents of which are incorporated into this specification by this reference.

5 mg of polyvinlyacetate was added to 1 ml of 0.7 M $PbI_2$ with 40 mol % $CH_3NH_3I$ as a crystallization retardant. For these experiments a 200 µm gap between a meniscus guide and the substrate was used to maximize the wet film thickness. Coating was carried out at speed of 5 mm/s with 1 µL/cm² solution feed with gas quenching as described in relation to FIG. 2 above and as taught in Hwang et al (see Example 1). Films were kept in open environment, i.e. no soaking process to produce mesoporous PbI$_2$ film. CH$_3$NH$_3$I solution (10 mg/mL) in 2-propanol was prepared for perovskite conversion. The PbI$_2$ layers were dipped into the CH$_3$NH$_3$I solution for 1 min, rinsed with 2-propanol before the film dried, and then the solvent was quickly removed by N$_2$ gas-blowing.

Device Fabrication

The perovskite layer formed on the coated substrates was coated with a hole transporting layer immediately after perovskite formation to minimize exposure to moisture. For the hole transporting layer, 1 mL of P3HT (Merck) solution (15 mg/mL in chlorobenzene), 6.8 µL of Li-bis(trifluoromethanesulfonyl) imide (28.3 mg/mL in acetonitrile) and 3.4 µL of 4-tert-butylpyridine were mixed, and then transferred to the slot die head without filtration. The solution was coated onto the perovskite film at 7 mm/s speed with 3 µL/cm$^2$ solution feed without thermal treatment, and the gap between the meniscus guide and the substrate was also fixed at 100 µm. It is noteworthy that all slot die coating processes were carried out in air. Temperature and relative humidity were typically 25 to 30° C. and 30 to 40%, respectively. For an evaporated electrode, the samples were carried to a vacuum evaporator and 100 nm of Ag was deposited through a shadow mask to produce a 10 mm$^2$ active area.

Results

Figure 7:
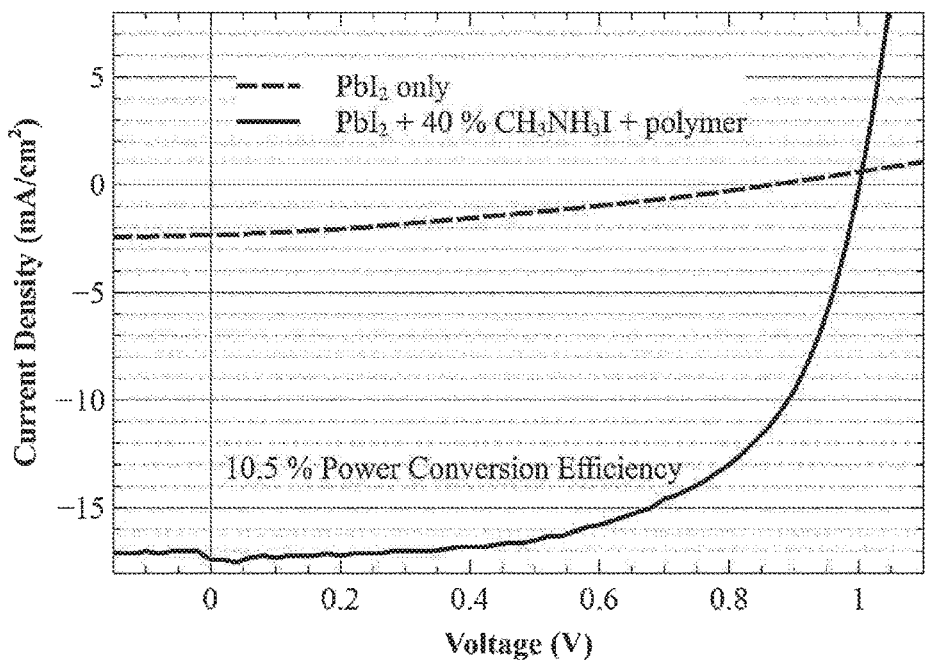
FIG. 7 shows a current density-voltage (J-V) curves of perovskite devices fabricated by same soaking-free process using conventional pure $PbI_2$ and $CH_3NH_3I$ and polymer added $PbI_2$ precursors.
Figure 8:
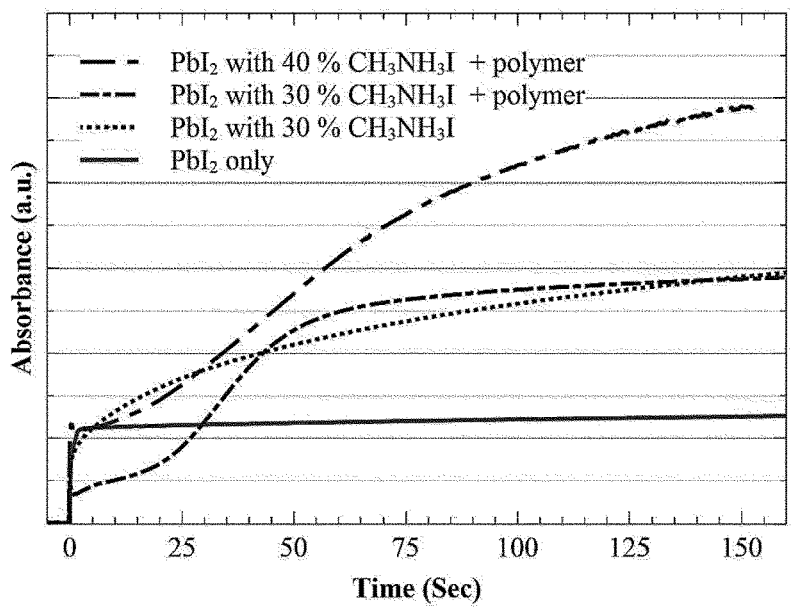
FIG. 8 shows the relative conversion rates of intermediates of sequentially deposited perovskite layer monitored by absorbance of the film during dipping conversion process in $CH_3NH_3I$ in 2-propanol.

The device results are shown in FIG. 7 which provide output curves of perovskite solar cells with a device configuration of ITO/ZnO/perovskite (CH$_3$NH$_3$PbI$_3$) with and without polyvinylacetate/P3HT/Ag fabricated by sequential deposition process. As shown in FIG. 7, the effect of polymer was significant. Devices made from PbI$_2$ with 40 mol % CH$_3$NH$_3$I showed no photovoltaic behaviour as shown in FIG. 6. Additional process improving additive further retards crystallization. Without soaking process over 10% power conversion efficiency was achieved.

The perovskite photoactive layers were fabricated using a similar methodology as set out in Example 5. However, here the range of different PbI$_2$ solution compositions were applied with additives comprising (A) PbI$_2$ solution (no CH$_3$NH$_3$I); (B) PbI$_2$ with 30% CH$_3$NH$_3$I; (c) PbI$_2$ with 30% CH$_3$NH$_3$I and 5 mg/ml of polyvinylacetate; (D) PbI$_2$ with 40% CH$_3$NH$_3$I and 5 mg/ml of polyvinylacetate. Polymer additive made it possible to process higher content of CH$_3$NH$_3$I. Therefore, more rapid conversion could be achieved.

Example 6—Slot Die Coated Perovskite Solar Cells Via Roll-to-Roll Printer

Photoactive Layer Fabrication:

ITO-coated PET substrate (0050, Solutia) was used as a substrate to produce flexible perovskite solar cells using Mini-Labo coater (Yasui Seiki). ZnO nanoparticle solution (20 mg/ml in ethanol) was coated onto ITO glass using a slot die head with 50 µm shim and 200 µm-thick meniscus guide at 0.2 m/min coating speed and 10 µL/min solution feed. The film was dried by hot air at 120° C. for 20 sec and on a curved hot plate at 140° C. for 20 sec in the roll-to-roll coater.

Figure 9A:
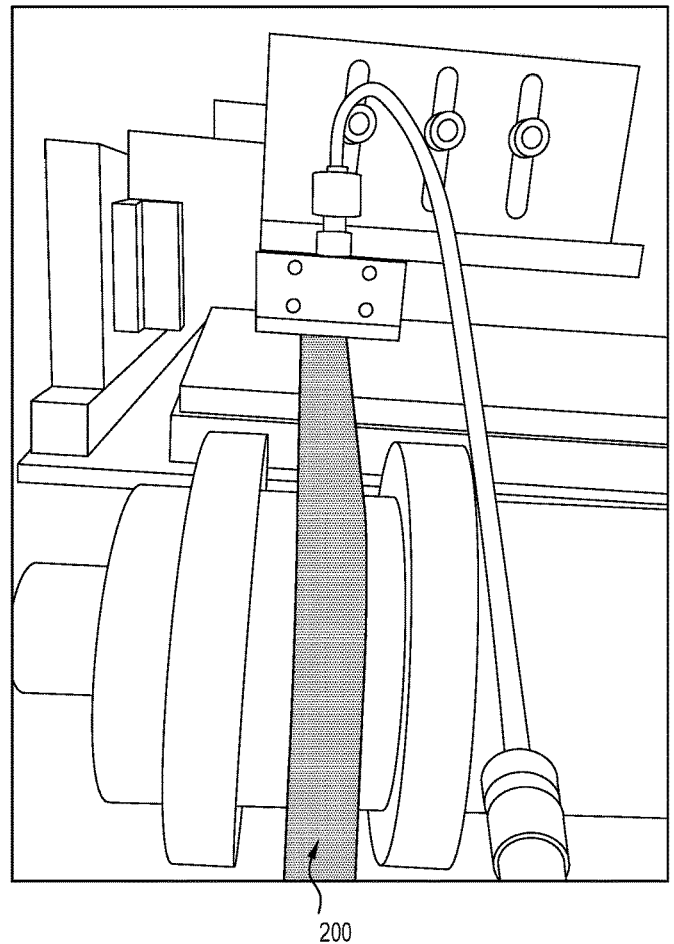
FIG. 9a shows a photograph of a roll-to-roll conversion process of $CH_3NH_3I$ added intermediate according to one embodiment of the present invention.
Figure 9B:
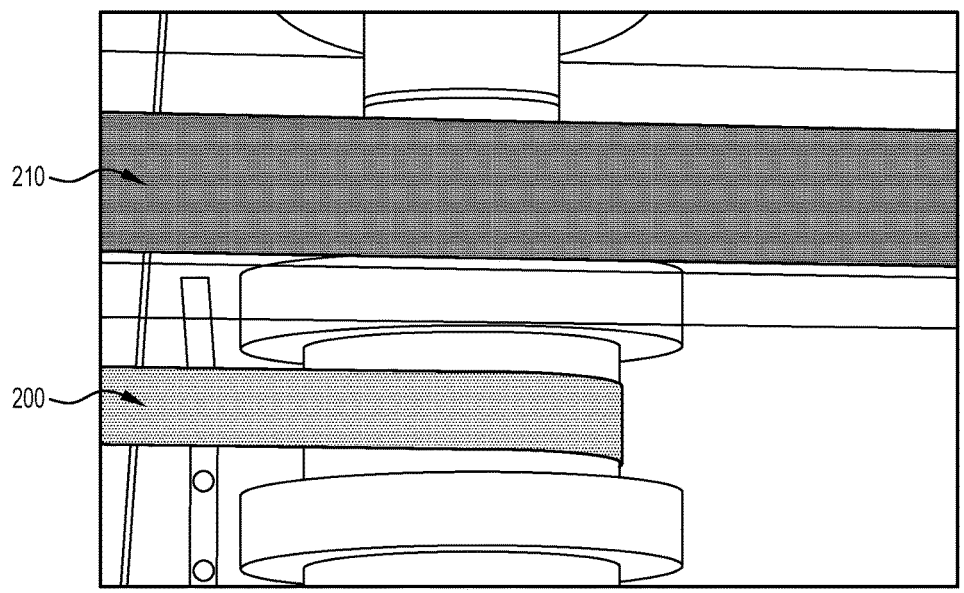

The perovskite photoactive layers were fabricated using a similar methodology as set out in Example 1. However, here different substrate and printing machine is used. For these experiments a 200 µm gap between a meniscus guide and the substrate was used to maximize the wet film thickness. Coating was carried out at speed of 0.2 m/min with 20 µL/min solution feed with gas quenching as described in relation to FIG. 2 above and as taught in Hwang et al (see Example 1). CH$_3$NH$_3$I solution (40 mg/mL) in 2-propanol was deposited on the film at 70° C. with coating speed of 0.2 m/min with 40 µL/min solution feed. The conversion process is shown in FIGS. 9a and 9b which show the a photograph of the roll-to-roll conversion process of CH$_3$NH$_3$I added intermediate 200 (FIG. 9a) and a photograph of the intermediate 200 and formed perovskite 210 during roll-to-roll process (FIG. 9b).

Device Fabrication

The perovskite layer formed on the coated substrates was coated with a hole transporting layer. For the hole transporting layer, 1 mL of P3HT (Merck) solution (15 mg/mL in chlorobenzene), 6.8 µL of Li-bis(trifluoromethanesulfonyl) imide (28.3 mg/mL in acetonitrile) and 3.4 µL of 4-tert-butylpyridine were mixed, and then transferred to the slot die head without filtration. The solution was coated onto the perovskite film at 0.3 m/min speed with 40 µL/min solution feed without thermal treatment, and the gap between the meniscus guide and the substrate was also fixed at 100 µm. It is noteworthy that all slot die coating processes were carried out in air. Temperature and relative humidity were typically 25 to 30° C. and 30 to 40%, respectively. For an evaporated electrode, the samples were carried to a vacuum evaporator and 10 nm of MoOx and 100 nm of Ag were deposited through a shadow mask to produce a 10 mm$^2$ active area.

Results

Figure 10:
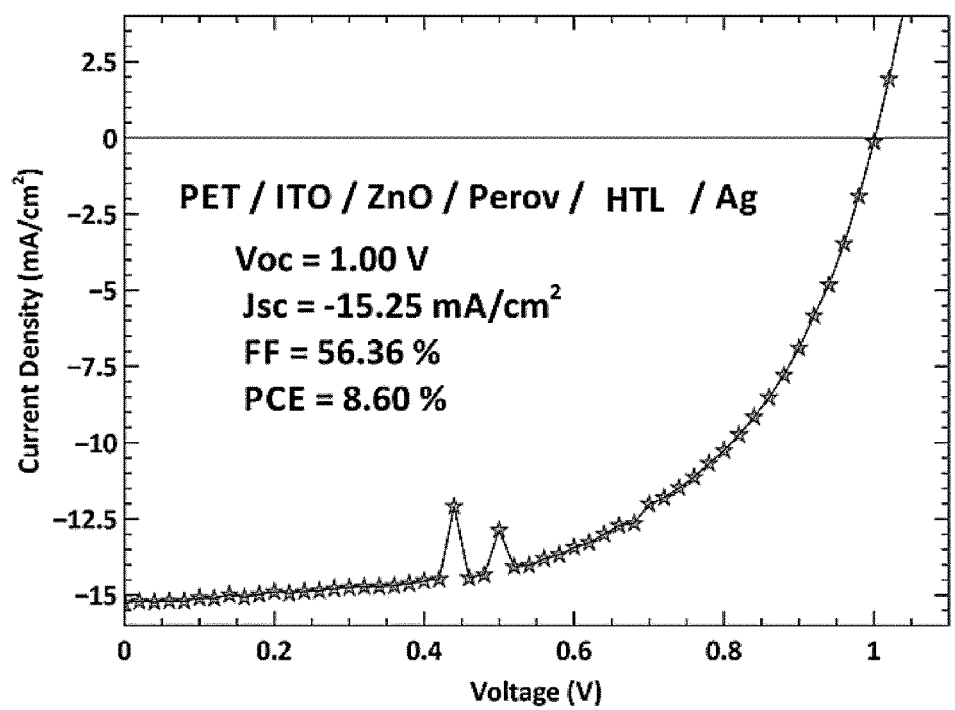
FIG. 10 provides a current density-voltage (J-V) curve of roll-to-roll printed perovskite device fabricated by one embodiment of the present invention

The device results are shown in FIG. 10 which provide average power conversion efficiency perovskite solar cells with a device configuration of ITO/ZnO/perovskite (CH$_3$NH$_3$PbI$_3$)/P3HT solution/MoOx/Ag fabricated by sequential deposition process. The device made on plastic substrate using industrial process showed 8.6% power conversion efficiency.

Those skilled in the art will appreciate that the invention described herein is susceptible to variations and modifications other than those specifically described. It is understood that the invention includes all such variations and modifications which fall within the spirit and scope of the present invention.

Where the terms "comprise", "comprises", "comprised" or "comprising" are used in this specification (including the claims) they are to be interpreted as specifying the presence of the stated features, integers, steps or components, but not precluding the presence of one or more other feature, integer, step, component or group thereof.

The invention claimed is:
1. A process of forming a photoactive layer of a flexible planar perovskite photoactive device comprising:
  applying at least one layer of a first precursor solution to a flexible planar substrate to form a first precursor coating on at least one surface of the substrate, the first precursor solution comprising MX2 and AX dissolved in a first coating solvent, wherein the molar ratio of MX2:AX=1:n with 0<n<1; and
  applying a second precursor solution to the first precursor coating to convert the first precursor coating to a perovskite layer AMX3, the second precursor solution comprising AX dissolved in a second coating solvent, the first precursor solution reacting with the second precursor solution to form a perovskite layer AMX3 on the substrate, thereby forming a photoactive layer of the flexible planar perovskite photoactive device,
  wherein A comprises an ammonium group or other nitrogen containing organic cation, M is selected from Pb,

Sn, Ge, Ca, Sr, Cd, Cu, Ni, Mn, Co, Zn, Fe, Mg, Ba, Si, Ti, Bi, or In, X is selected from at least one of F, Cl, Br or I.

2. The process according to claim 1, wherein the molar ratio of $MX_2:AX=1:n$ with $0<n\leq 0.5$.

3. The process according to claim 1, wherein the process further involves the step of:
drying the first precursor coating prior to applying the second precursor solution.

4. The process according to claim 1, wherein the process further involves the step of:
subjecting the substrate with first precursor coating to a solvent vapour soaking process before applying the second precursor solution to the first precursor coating.

5. The process according to claim 4, wherein the substrate is subjected to the solvent vapour soaking process immediately after the first precursor solution is applied to the substrate.

6. The process according to claim 1, wherein $MX_2$ and AX are soluble in the first coating solvent, AX is soluble in the second coating solvent, and $MX_2$ has a low to zero solubility in the second coating solvent.

7. The process according to claim 1, wherein the first coating solvent comprises DMF, DMSO, Y-butyrolactone, acetone, acetyl acetone, ethyl acetoacetate, NMP, DMAC, THF or combinations thereof.

8. The process according to claim 1, wherein the second coating solvent is at least one of including isopropanol, n-butanol, isobutanol, ethanol, methanol, acetic acid, ethylene glycol, propylene glycol, glycerol, allyl alcohol, propagyl alcohol, inositol or combinations thereof.

9. The process according to claim 1, wherein A in AX comprises an organic cation having the formula $(R_1R_2R_3R_4N)$, wherein:
$R_1$ is hydrogen, unsubstituted or substituted C1-C20 alkyl, or unsubstituted or substituted aryl;
$R_2$ is hydrogen, unsubstituted or substituted C1-C20 alkyl, or unsubstituted or substituted aryl;
$R_3$ is hydrogen, unsubstituted or substituted C1-C20 alkyl, or unsubstituted or substituted aryl; and
$R_4$ is hydrogen, unsubstituted or substituted C1-C20 alkyl, or unsubstituted or substituted aryl.

10. The process according to claim 1, wherein A in AX comprises an organic cation having the formula $(R_5R_6N=CH-NR_7R_8)$, and wherein:
$R_5$ is hydrogen, unsubstituted or substituted C1-C20 alkyl, or unsubstituted or substituted aryl;
$R_6$ is hydrogen, unsubstituted or substituted C1-C20 alkyl, or unsubstituted or substituted aryl;
$R_7$ is hydrogen, unsubstituted or substituted C1-C20 alkyl, or unsubstituted or substituted aryl; and
$R_8$ is hydrogen, unsubstituted or substituted C1-C20 alkyl, or unsubstituted or substituted aryl.

11. The process according to claim 9, wherein AX is selected from the group consisting of $CH_3NH_3X$ and $HC(NH_2)_2X$, and wherein X is selected from at least one of F, Cl, Br or I.

12. The process according to claim 1, wherein the perovskite layer comprises an organo-metal halide perovskite.

13. The process according to claim 12, wherein the perovskite layer comprises at least one of $CH_3NH_3MX_3$ or $HC(NH_2)_2MX_3$, in which, M is selected from Pb, Sn, Tl, Bi, or In; and X is selected from at least one of F, Cl, Br or I.

14. The process according to claim 1, wherein the second precursor solution comprises from 5 to 75 wt % AX.

15. The process according to claim 1, wherein the substrate comprises at least one of a polymer, metal, ceramic or glass.

16. The process according to claim 1, wherein the substrate includes one or more layers or coatings selected from at least one of:
at least one coating of a transparent conductive oxide (TCO);
at least one hole transporting layer comprising an organic or inorganic semiconductor; or
at least one electron transporting layer comprising an organic or inorganic conductor.

17. The process according to claim 1, wherein the first precursor coating has a dry layer thickness from 100 nm to 600 nm.

18. The process according to claim 1, wherein at least one of the first perovskite precursor solution or the second precursor solution further comprises a perovskite crystallisation retardant comprising a polymer additive which is soluble in the respective first coating solvent or second coating solvent.

19. The process according to claim 18, wherein the polymer additive is selected from the group consisting of poly vinyl alcohol, poly vinyl acetate (PVAc), ABS, poly amides, poly acrylics, poly imide, poly acrylonitrile, poly butyl methacrylate, poly butadiene, poly carboxy methyl cellulose, poly ethers, poly ethylene acrylates, poly glycols, poly isocyanates, poly methacrylates, poly vinyl butyral, poly vinyl fluoride, poly vinyl methyl ethers, poly amines, polyethylene oxide, polyethylene glycol Poly(2-ethyl-2-oxazoline) and combinations thereof.

20. The process according to claim 1, wherein AX from the first precursor solution is incorporated into the final perovskite layer $AMX_3$.

* * * * *